(12) United States Patent
Guidry et al.

(10) Patent No.: US 12,132,052 B2
(45) Date of Patent: Oct. 29, 2024

(54) DEVICES FOR INTEGRATED FRONT-END CIRCUITS

(71) Applicant: MONDE Wireless Inc., Goleta, CA (US)

(72) Inventors: Matthew Guidry, Goleta, CA (US); Brian Romanczyk, Goleta, CA (US)

(73) Assignee: MONDE Wireless, Inc., Goleta, CA (US)

( * ) Notice: Subject to any disclaimer, the term of this patent is extended or adjusted under 35 U.S.C. 154(b) by 0 days.

(21) Appl. No.: 18/077,539

(22) Filed: Dec. 8, 2022

(65) Prior Publication Data

US 2024/0038761 A1 Feb. 1, 2024

Related U.S. Application Data

(63) Continuation of application No. PCT/US2022/038873, filed on Jul. 29, 2022.

(51) Int. Cl.
| | |
|---|---|
| *H01L 27/095* | (2006.01) |
| *H01L 21/8252* | (2006.01) |
| *H01L 27/06* | (2006.01) |
| *H01L 27/088* | (2006.01) |
| *H01L 29/20* | (2006.01) |
| *H01L 29/205* | (2006.01) |

(Continued)

(52) U.S. Cl.
CPC ........ *H01L 27/095* (2013.01); *H01L 21/8252* (2013.01); *H01L 27/0605* (2013.01); *H01L 27/088* (2013.01); *H01L 29/2003* (2013.01); *H01L 29/205* (2013.01); *H01L 29/66462* (2013.01); *H01L 29/7786* (2013.01)

(58) Field of Classification Search
CPC . H01L 27/088; H01L 27/095; H01L 29/7786; H01L 29/7787
See application file for complete search history.

(56) References Cited

U.S. PATENT DOCUMENTS

| | | | |
|---|---|---|---|
| 2009/0065810 A1* | 3/2009 | Honea | H01L 27/0605 257/192 |
| 2009/0072269 A1* | 3/2009 | Suh | H01L 21/8252 257/136 |

(Continued)

OTHER PUBLICATIONS

Notification of Transmittal of the International Search Report and the Written Opinion of the International Searching Authority, or the Declaration for International Application No. PCT/US2022/038873 (Oct. 18, 2022).

*Primary Examiner* — Grant S Withers
(74) *Attorney, Agent, or Firm* — THE MARBURY LAW GROUP, PLLC

(57) ABSTRACT

A wireless front-end can include a plurality of circuits, including a power amplifier (PA), a low noise amplifier (LNA), and an RF switch. In order to decrease the size and improve the performance of the front-end, the various circuits of the front end can include N-polar III-N transistors that are all formed from the same epitaxial material structure and monolithically integrated onto a single chip. Due to the different performance requirements of the various transistors in the different circuits, parameters such as gate length, gate-to-channel separation, and surface-to-channel separation in the access regions of the devices can be varied to meet the desired performance requirements.

8 Claims, 17 Drawing Sheets

(51) Int. Cl.
*H01L 29/66* (2006.01)
*H01L 29/778* (2006.01)

(56) References Cited

U.S. PATENT DOCUMENTS

| | | | |
|---|---|---|---|
| 2009/0146185 A1* | 6/2009 | Suh | H01L 29/42364 |
| | | | 257/E27.061 |
| 2012/0187452 A1* | 7/2012 | Saito | H01L 29/66462 |
| | | | 257/E29.091 |
| 2014/0252368 A1* | 9/2014 | Lee | H01L 29/4175 |
| | | | 257/194 |
| 2017/0365702 A1 | 12/2017 | Prechtl et al. | |
| 2020/0203484 A1 | 6/2020 | Nidhi et al. | |
| 2020/0343375 A1 | 10/2020 | Mishra et al. | |
| 2020/0350399 A1* | 11/2020 | Wong | H01L 29/66318 |
| 2020/0395358 A1* | 12/2020 | Radosavljevic | H01L 27/0605 |
| 2021/0399121 A1 | 12/2021 | Romanczyk et al. | |
| 2022/0223429 A1 | 7/2022 | Romanczyk et al. | |

* cited by examiner

DEVICES FOR INTEGRATED FRONT-END CIRCUITS

RELATED APPLICATIONS

This application is a continuation of and claims priority to PCT Application Serial No. PCT/US2022/038873, filed Jul. 29, 2022, the disclosure of which is incorporated herein by reference in its entirety.

TECHNICAL FIELD

The current disclosure relates to semiconductor material structures and devices, and in particular devices formed from N-polar III-Nitride layers.

BACKGROUND

III-Nitride semiconductor devices such as III-N high electron mobility transistors (HEMTs) are commonly formed from a III-N material structure grown in a group-III polar orientation (i.e., in the [0 0 0 1] direction) on a substrate. An example group-III polar III-N HEMT device 100 is shown in FIG. 1. In device 100, III-N layers 111, 112, and 113 are formed in a group-III polar orientation (i.e., in the [0 0 0 1] direction, as shown) on a suitable substrate 110 such as silicon (Si), silicon carbide (SiC), sapphire, or GaN. III-N layer 111 is a buffer layer and can be formed of AlN, AlGaN, GaN, or combinations thereof. III-N layer 112 is a channel layer, for example GaN. III-N layer 113 is a barrier layer, for example AlGaN. The composition of III-N layers 112 and 113 are selected such that a two-dimensional electron gas (2DEG) channel 120 is induced in the III-N channel layer 112 extending from the source 121 to the drain 122. A gate insulator 132 is formed over the III-N barrier layer 113, and a gate 123 is formed over the gate insulator 132. Voltages applied to the gate 123 relative to the source 121 modulate the charge in 2DEG 120 directly below the gate 123, thereby modulating the current that flows between the source 121 and the drain 122 during device operation.

A nitrogen-polar (N-polar) III-N HEMT device 200 (i.e., a device in which III-N layers 211, 213, and 212 are oriented in the [0 0 0 -1] direction over substrate 210) is shown in FIG. 2. In device 200, the III-N channel layer 212 (i.e., the layer containing 2DEG channel 220) is formed over the III-N barrier layer 213 (hence in an N-polar III-N HEMT the barrier layer is often referred to as a "backbarrier"). Gate insulator 232 can serve to reduce gate leakage, which may otherwise be more persistent in an N-polar device as compared to a group III-polar device, since in an N-polar device the III-N barrier layer (e.g., layer 213) is not between the gate 223 and the channel. Depending on the specific device geometry, N-polar III-N transistors may have properties and characteristics that are well suited for a number of circuit applications.

SUMMARY

In a first aspect, a semiconductor device includes a semiconductor wafer comprising a III-N material structure, the III-N material structure comprising: a III-N backbarrier; and a III-N channel layer over an N-face of the III-N backbarrier, the III-N channel layer having a group-III face adjacent to the III-N backbarrier and an N-face on a side opposite the group-III face, wherein a bandgap of the III-N backbarrier is greater than a bandgap of the III-N channel layer. The semiconductor device includes a first transistor in a first region of the semiconductor wafer, the first transistor comprising: a first portion of the III-N backbarrier; a first portion of the III-N channel layer having a first 2DEG channel therein, wherein the first portion of the III-N channel layer has a first recess adjacent to its N-face, the first recess having a first bottom surface; a first gate that is at least partially in the first recess; and a first source and a first drain, wherein the first gate is between the first source and the first drain. The semiconductor device includes a second transistor in a second region of the semiconductor wafer, the second transistor comprising: a second portion of the III-N backbarrier; a second portion of the III-N channel layer having a second 2DEG channel therein, wherein the second portion of the III-N channel layer has a second recess adjacent to its N-face, the second recess having a second bottom surface; a second gate that is at least partially in the second recess; and a second source and a second drain, wherein the second gate is between the second source and the second drain; wherein a thickness of the first portion of the III-N channel layer in a region between the first gate and the first drain is greater than 1.2 times a thickness of the second portion of the III-N channel layer in a region between the second gate and the second drain.

DESCRIPTION OF DRAWINGS

Like numbers in the drawings represent like elements.

DETAILED DESCRIPTION

Figure 1:
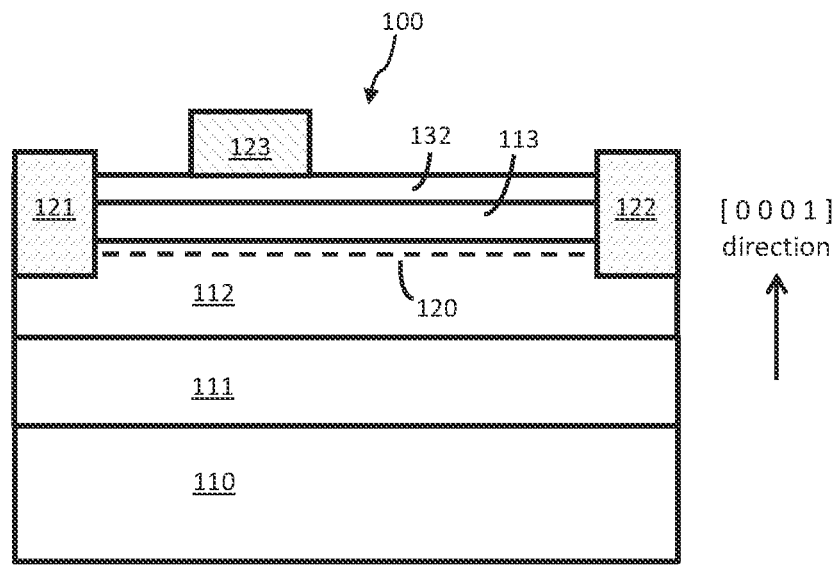
FIG. 1 is a cross-sectional view of a group-III polar III-N transistor device.
Figure 2:
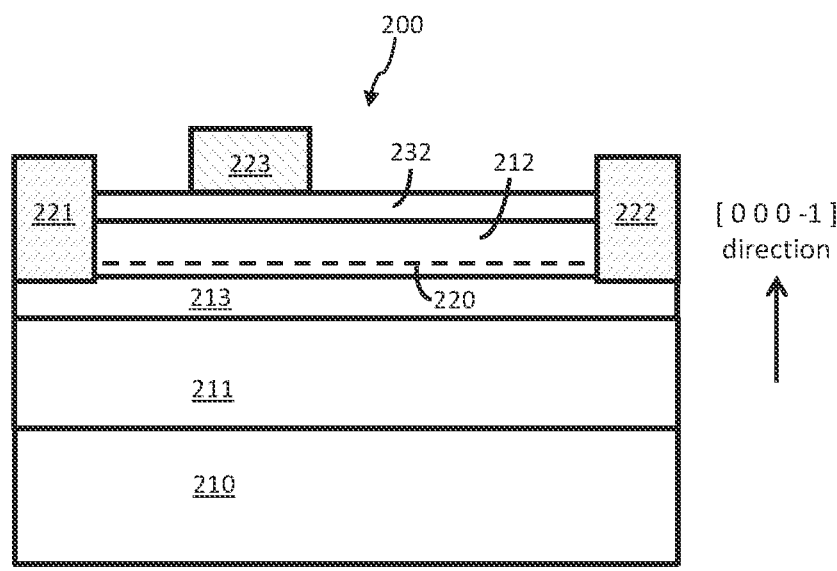
FIG. 2 is a cross-sectional view of an N-polar III-N transistor device.
Figure 3:
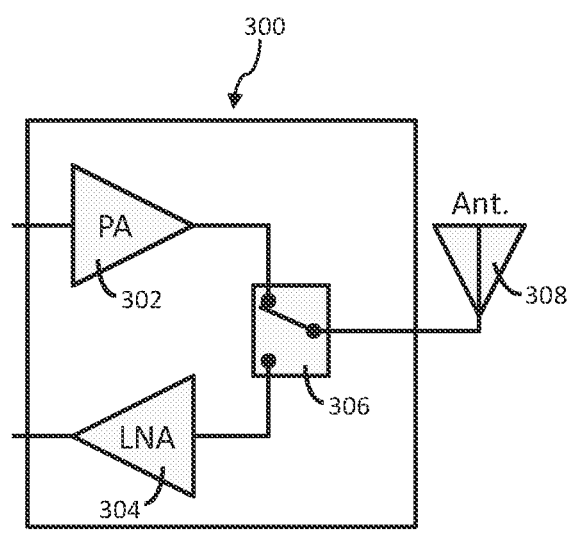
FIG. 3 is a block diagram of an example transmit/receive front-end circuit.

A wireless front-end typically includes a plurality of circuits, including both active transistor-based and diode-based circuits and passive electromagnetic or acoustic based circuits. Examples of transistor-based circuits that may be used include a power amplifier (PA), a low noise amplifier (LNA), a switch (e.g., an RF switch), an active filter (e.g., an N-path filter), a frequency translation circuit such as a frequency multiplier or a mixer, and/or beamforming circuitry that includes a phase shifter, a variable gain amplifier or variable attenuator, and/or switched delay lines. Examples of passive electromagnetic or acoustic based circuits that may be used include filters (e.g., bandpass, high pass, or low pass filters), multiplexing filters (e.g., diplexers, triplexers, n-plexers), and/or an antenna. For the transistor-based circuits, each circuit includes transistors that are specifically designed and configured to meet the performance requirements of the particular circuit. Because of the varying performance requirements among the different circuits, it is common to separately design and fabricate each circuit and then subsequently connect them to one another to form the front-end. A block diagram of an example transmit/receive (T/R) front-end 300 connected to an antenna 308 is shown in FIG. 3. As shown, the T/R front-end 300 includes a PA 302, an LNA 304, and a T/R switch 306.

In the front-end 300 shown in FIG. 3, the PA 302 can be formed of or include N-Polar III-N transistors having a first geometry that provides optimal performance for the PA, the LNA 304 can be formed of or include N-polar III-N transistors having a second geometry that provides optimal performance for the LNA, and the switch 306 can be formed of or include N-polar III-N transistors having a third geometry that provides optimal performance for the switch. As used herein, the terms III-Nitride or III-N materials, layers, devices, etc., refer to a material or device comprised of a compound semiconductor material according to the stoichiometric formula $Sc_vB_wAl_xIn_yGa_zN_a(D)_b$, where $v+w+x+y+z$ is about 1, $0 \leq v \leq 1$, $0 \leq w \leq 1$, $0 \leq x \leq 1$, $\leq y \leq 1$, $0 \leq z \leq 1$, $a+b$ is about 1, $0.9 < a \leq 1$, $0 \leq b < 0.1$, and (D) is any group-V element other than nitrogen. In a III-N transistor device, the channel through which current conducts can be contained within one or more III-N layers of the device.

Described herein are semiconductor devices that include transistors from two or more circuits (e.g., circuits of a front-end) that are monolithically integrated on a single semiconductor wafer. That is, a common set of semiconductor material layers such as N-polar III-Nitride layers that are formed (e.g., epitaxially grown) on a common substrate are used to form transistors of the two or more circuits. The design and geometry of each transistor may be optimized for the specific circuit, or portion of the circuit, in which it is used. Optionally interconnect metals that connect the transistors to one another or to other circuit components are also formed on the common semiconductor material layers. Integrating these transistors onto a single wafer can reduce the total cost, reduce the size or footprint, and/or improve the performance of the front-end.

Figure 4:
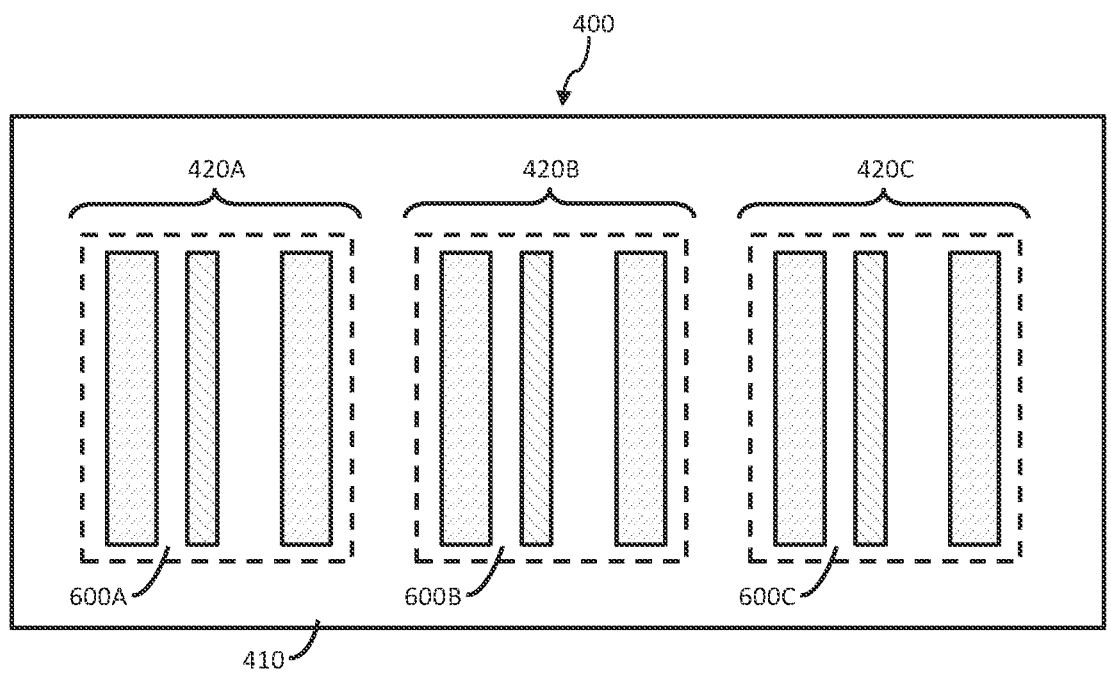
FIG. 4 is a plan view of a semiconductor device.

FIG. 4 is a plan view of a semiconductor device 400 formed from a semiconductor wafer 410. The semiconductor wafer 410 includes a plurality of III-N semiconductor layers (shown in FIG. 5) that form a III-N material structure. Semiconductor device 400 includes a first transistor 600A formed from a first portion of the III-N material structure (the portion contained within region 420A), a second transistor 600B formed from a second portion of the III-N material structure (the portion contained within region 420B), and a third transistor 600C formed from a third portion of the III-N material structure (the portion contained within region 420C). As shown, transistors 600A, 600B, and 600C are monolithically integrated on the semiconductor wafer 410. Transistors 600A, 600B, and 600C can each be components of different circuits of a front-end. For example, as further described below, transistor 600A can be part of a PA, transistor 600B can be part of an LNA, and transistor 600C can be part of a switch (e.g., an RF switch that may be operated as a T/R switch). Although FIG. 4 shows all three transistors 600A-600C integrated on semiconductor wafer 410, semiconductor devices that include any two of these three transistors integrated on a semiconductor wafer can also be formed. As used herein, a "semiconductor wafer" refers to a continuous structure including one or more semiconductor layers in which for each semiconductor layer, the layer (and each portion of the layer) is formed via a single epitaxial growth.

Figure 5:
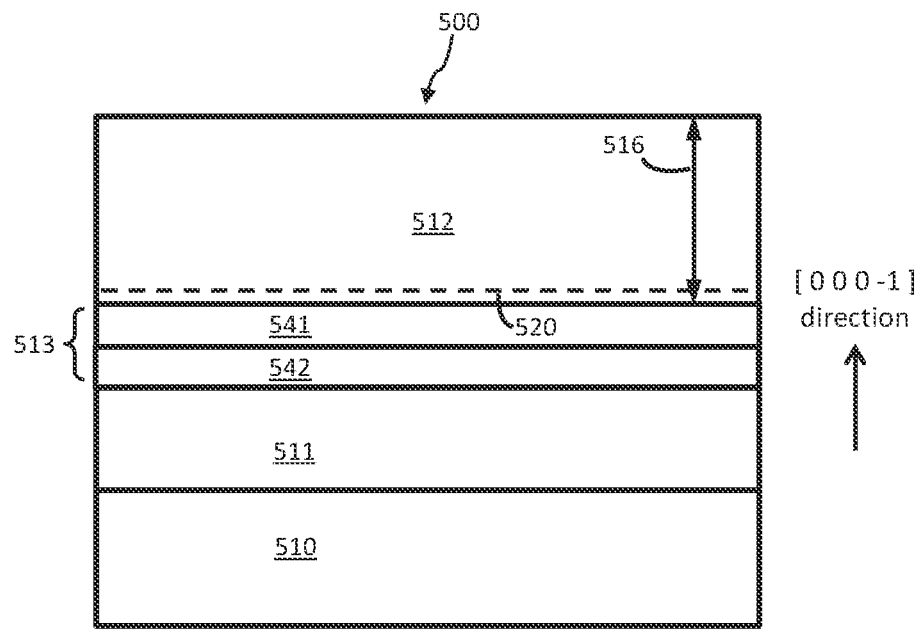
FIG. 5 is a cross-sectional view of an epitaxially formed N-polar III-N material structure.

FIG. 5 is a cross-sectional view of an epitaxially formed N-polar III-N material structure 500 from which semiconductor wafer 410 of FIG. 4 can be formed. Material structure 500 includes a substrate 510 and a plurality of III-N layers 511, 513, and 512 that are formed in an N-polar orientation (i.e., in the [0 0 0 −1] direction, as shown) on the substrate 510. The substrate 510 can be any substrate suitable for the epitaxial growth of III-N layers thereon, for example silicon (Si), silicon carbide (SiC), aluminum nitride (AlN), gallium nitride (GaN), or sapphire ($Al_2O_3$). III-N layer 511 is a buffer layer and can be formed of AlN, AlGaN, GaN, or combinations thereof. III-N layer 513, which is formed over an N-face of III-N buffer layer 511, functions as a backbarrier. III-N layer 512, which is formed over an N-face of III-N backbarrier 513 with its group-III face adjacent to the III-N backbarrier 513 and its N-face on a side opposite its group-III face, functions as a channel layer.

The composition of III-N backbarrier 513 and III-N channel layer 512 are selected such that a two-dimensional electron gas (2DEG) channel 520 is induced in the III-N channel layer 512 adjacent to the interface between III-N channel layer 512 and III-N backbarrier 513. In order for the 2DEG channel 520 to be induced, the compositions of III-N layers 512 and 513 can be selected such that adjacent to the interface between layers 512 and 513, the conduction band energy in III-N backbarrier 513 is greater than the conduction band energy in III-N channel layer 512. That is, at the interface between III-N layers 512 and 513, the conduction band energy can be discontinuous, with a greater conduction band energy on the backbarrier side of the interface than on the channel layer side of the interface. Such a conduction band energy discontinuity can typically be achieved by selecting a material for III-N channel layer 512 that has a smaller bandgap than that of III-N backbarrier 513. For example, III-N channel layer 512 can be formed of GaN and III-N backbarrier 513 can be formed of $Al_xGa_{1-x}N$, where the aluminum fractional composition x can be in the range of $0.1 \leq x \leq 0.6$ (e.g., in the range of $0.2 \leq x \leq 0.4$).

III-N backbarrier 513 can be formed as a single III-N layer or as multiple III-N layers. For example, as seen in FIG. 5, in which backbarrier 513 is implemented as multiple III-N layers, III-N backbarrier 513 can include a first III-N layer 541 and a second III-N layer 542. In cases where III-N backbarrier 513 is formed as a single layer, the entire III-N backbarrier 513 is implemented as the first III-N layer. In cases where III-N backbarrier 513 is formed as multiple III-N layers, the first III-N layer 541 can be adjacent to and can directly contact III-N channel layer 512, such that the 2DEG channel 520 is adjacent to the interface between the III-N channel layer 512 and the first III-N layer 541 of III-N backbarrier 513. In this case, the first III-N layer 541 may have a bandgap that is greater than that of III-N channel layer 512. In some implementations, the first III-N layer 541 is formed of AlN.

Figure 6A:
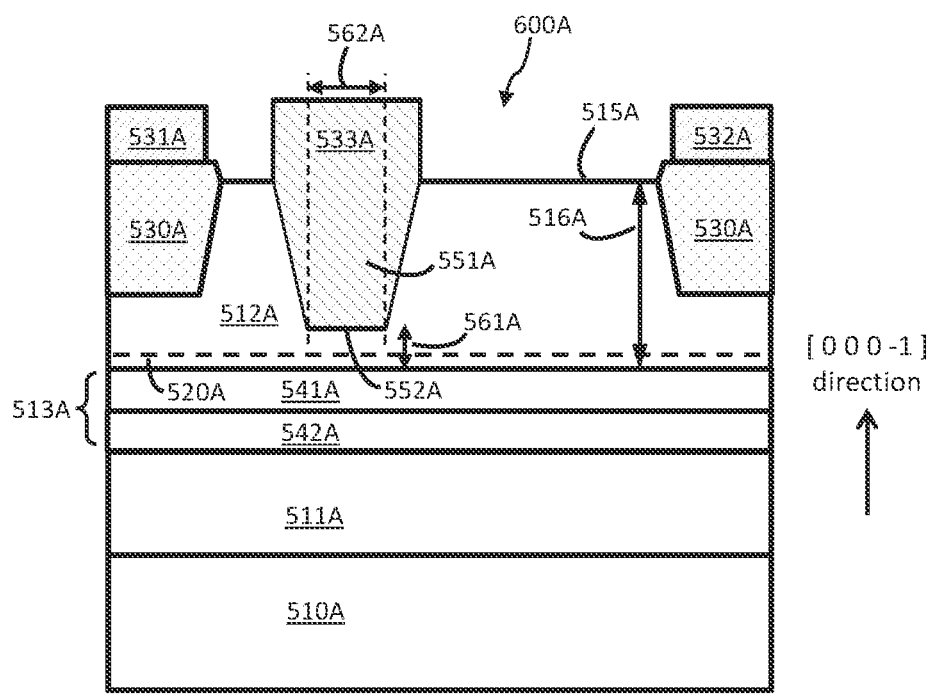
FIGS. 6A, 6B, 6C, 6D, and 6E are cross-sectional views of N-polar III-N transistor structures that can be monolithically integrated and used in the semiconductor device of FIG. 4.

FIGS. 6A, 6B, 6C, 6D, and 6E are cross-sectional views of the N-polar III-N transistor structures 600A, 600B, 600C, 600D, and 600E, respectively. Any two or more of these transistor structures can be monolithically integrated from the N-polar III-N material structure 500 of FIG. 5 and used to form the device 400 of FIG. 4. Referring to FIG. 6A, transistor 600A includes a first portion 513A of III-N backbarrier 513 (i.e., the portion of backbarrier 513 that is in the first region 420A of semiconductor wafer 410) and a first portion 512A of channel layer 512, where portion 512A of the channel layer has a first 2DEG channel 520A therein. The first portion 512A of the III-N channel layer has a first recess 551A formed therein adjacent to its N-face 515A, the first recess having a first bottom surface 552A. The first recess 551A can be formed by etching into the first portion 512A of the III-N channel layer. Transistor 600A further includes a first gate 533A that is formed of a metal or other conductive material and is at least partially in the first recess 551A. Transistor 600A also includes a first source 531A and a first drain 532A that are each formed of a metal or other conductive material and are positioned such that the first gate 533A is between the first source 531A and the first drain 532A. A regrown n+ region 530A is optionally formed beneath each of the source contact 531A and the drain contact 532A to reduce the contact resistance between the source/drain contacts and the first 2DEG channel 520A.

Figure 6B:
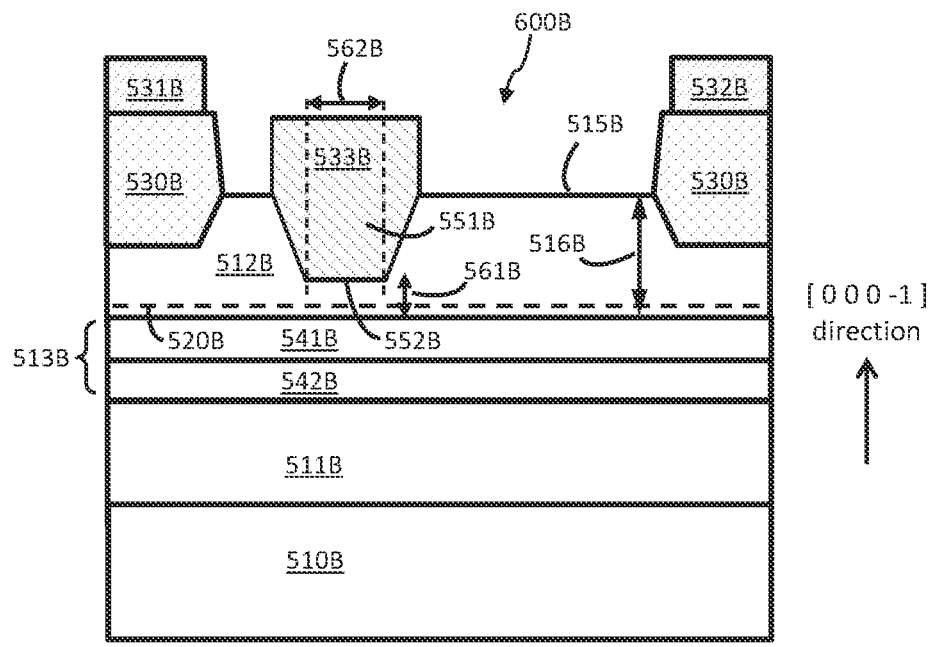

Referring to FIG. 6B, similar to transistor 600A, transistor 600B includes a second portion 513B of III-N backbarrier 513 (i.e., the portion of backbarrier 513 that is in the second region 420B of semiconductor wafer 410) and a second portion 512B of channel layer 512, where portion 512B of the channel layer has a second 2DEG channel 520B therein. Also similar to transistor 600A, in transistor 600B the second portion 512B of the III-N channel layer has a second recess 551B formed therein adjacent to its N-face 515B, the second recess having a second bottom surface 552B. The second recess 551B can be formed by etching into the second portion 512B of the III-N channel layer. Transistor 600B further includes a second gate 533B that is formed of a metal or other conductive material and is at least partially in the second recess 551B. Transistor 600B also includes a second source 531B and a second drain 532B that are each formed of a metal or other conductive material and are positioned such that the second gate 533B is between the second source 531B and the second drain 532B. A regrown n+ region 530B is optionally formed beneath each of the second source 531B and the second drain 532B to reduce the contact resistance between the second source/drain contacts and the second 2DEG channel 520B.

Still referring to transistor 600B of FIG. 6B, prior to forming the second recess 551B the second portion 512B of the III-N channel layer can be thinned, for example by etching. As such, the total thickness of the channel layer in the access regions of device 600A (i.e., the thickness 516A of the first portion 512A of the III-N channel layer in the region between the first gate 533A and the first drain 532A) is thicker than the total thickness of the channel layer in the access regions of device 600B (i.e., the thickness 516B of the second portion 512B of the III-N channel layer in the region between the second gate 533B and the second drain 532B). For example, thickness 516A can be greater than 1.1 times (e.g., greater than 1.2 times, greater than 1.3 times, greater than 1.4 times, greater than 1.5 times, greater than 1.6 times, greater than 1.8 times, or greater than 2 times) that of thickness 516B. As used herein, the "gate region" of a transistor refers to the region below the gate, the "contact regions" of a transistor refer to the regions below the source and drain contacts, and the "access regions" of a transistor refer to the regions between the gate region and the contact regions. The "source access region" refers to the access region between the source contact region and the gate region, and the "drain access region" refers to the access region between the drain contact region and the gate region.

Figure 6C:
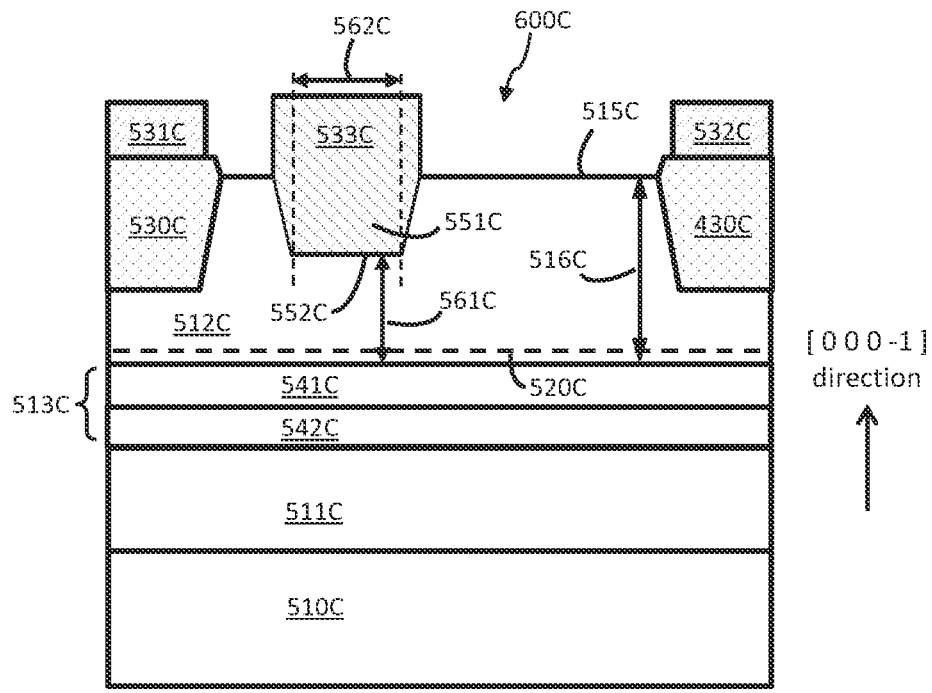

Referring now to FIG. 6C, similar to transistors 600A and 600B, transistor 600C includes a third portion 513C of III-N backbarrier 513 (i.e., the portion of backbarrier 513 that is in the third region 420C of semiconductor wafer 410) and a third portion 512C of channel layer 512, where portion 512C of the channel layer has a third 2DEG channel 520C therein. Also similar to transistors 600A and 600B, in transistor 600C the third portion 512C of the III-N channel layer has a third recess 551C formed therein adjacent to its N-face 515C, the third recess having a third bottom surface 552C. The third recess 551C can be formed by etching into the third portion 512C of the III-N channel layer. Transistor 600C further includes a third gate 533C that is formed of a metal or other conductive material and is at least partially in the third recess 551C. Transistor 600C also includes a third source 531C and a third drain 532C that are each formed of a metal or other conductive material and are positioned such that the third gate 533C is between the third source 531C and the third drain 532C. A regrown n+ region 530C is optionally formed beneath each of the third source 531C and the third drain 532C to reduce the contact resistance between the third source/drain contacts and the third 2DEG channel 520C.

Transistor 600C differs from transistor 600A in that a smaller thickness of channel layer 512C is removed to form the third recess 551C as compared to the thickness of channel layer 512A removed to form the first recess 551A. Consequently, the separation 561A between bottom surface 552A of the first recess 551A and the group-III face of the first portion 513A of the III-N backbarrier in transistor 600A is greater than the separation 561C between bottom surface 552C of the third recess 551C and the group-III face of the third portion 513C of the III-N backbarrier in transistor 600C. Separation 561C can, for example, be greater than 1.1 times, greater than 1.2 times, greater than 1.3 times, greater than 1.4 times, greater than 1.5 times, greater than 1.6 times, greater than 1.8 times, or greater than 2 times separation 561A. Optionally, the gate length 562C of transistor 600C can be larger than the gate length 562A of transistor 600A, for example larger than 1.1 times, 1.2 times, 1.3 times, 1.4 times, 1.5 times, 1.6 times, 1.8 times, 2 times, 2.5 times, or 3 times the gate length 562A of transistor 600A.

Figure 6D:
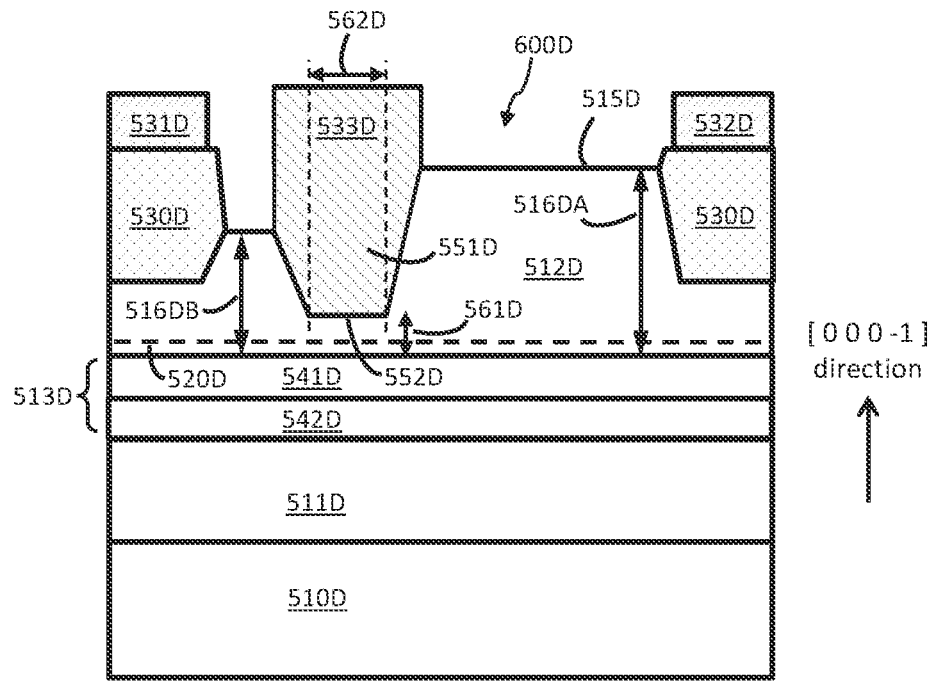

Referring now to FIG. 6D, transistor 600D is similar to transistor 600B, except that instead of thinning the entire channel layer 512D prior to forming recess 551D, the channel layer is thinned in the source access region (i.e., between the source 531D and the gate 533D) but is not thinned in the drain access region (i.e., between the drain 532D and the gate 533D). Accordingly, the thickness 516DA of the channel layer 512D in the drain access region can be the same as thickness 516A in FIG. 6A, and the thickness 516DB of the channel layer 512D in the source access region can be smaller than thickness 516DA. In some cases, the thickness 516DB can be substantially the same as thickness 516B in FIG. 6B.

In some implementations, separation 561C in transistor 600C is about the same as the thickness 516B of the of the thinned channel layer 512B in transistor 600B. For example, thickness 516B can be between 0.9 times separation 561C and 1.1 times separation 561C. Having these two thicknesses be about the same allows the same etch to be used for forming both recess 551C in transistor 600C and for thinning channel layer 512B in transistor 600B when the two devices are monolithically integrated on the same wafer, thereby simplifying the fabrication process. For similar reasons, the channel layer 512D in transistor 600D can have a thickness 516DB in the source access region that is about the same as separation 561C in transistor 600C. That is, thickness 516DB can be between 0.9 times separation 561C and 1.1 times separation 561C.

Figure 6E:
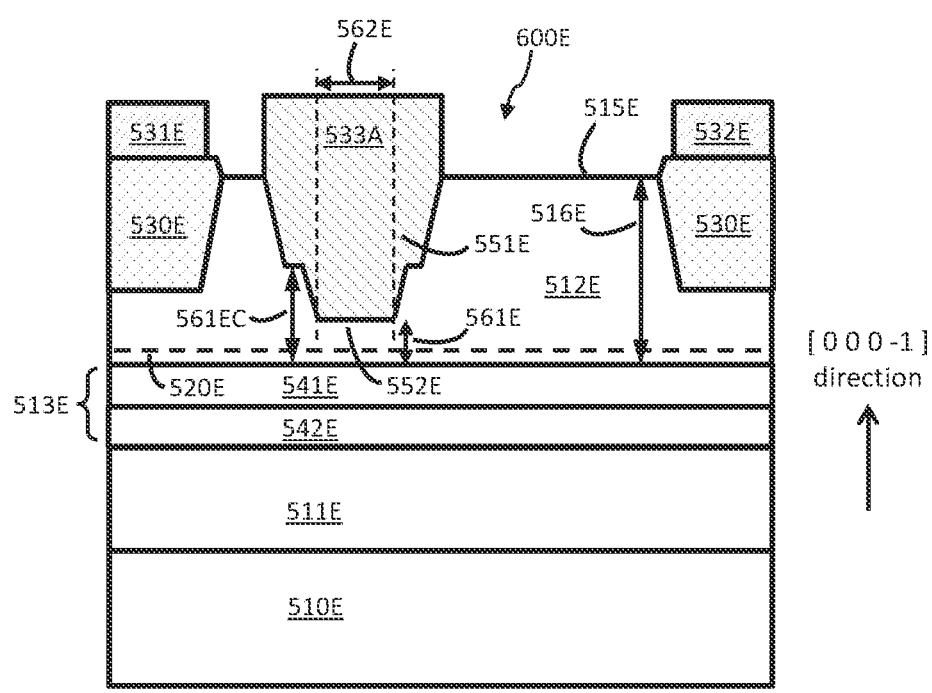

Referring now to FIG. 6E, transistor 600E is the same as transistor 600A, except that the shape of the recess 551E for transistor 600E is different than that of transistor 600A. Specifically, recess 551E includes one or more steps, as shown. Recess 551E can be formed in multiple steps. First, the upper part of the recess (i.e., above the step) can be formed by etching down to the depth of the step. A second etch can then be carried out to form the bottom part of recess 551E. In some implementations, the etch that forms the upper part of recess 551E is the same as the etch used to form recess 551C in transistor 600C (i.e., the upper portion of recess 551E and recess 551C are formed simultaneously). Accordingly, the separation 561EC between the step and the interface between layers 512E and 541E in transistor 600E can be about the same as separation 561C in transistor 600C. For example, separation 561EC can be between 0.9 times separation 561C and 1.1 times separation 561C.

The structure of any of transistors 600A, 600D, or 600E may be optimal for use in a power amplifier (PA), since the small gate-to-channel separation provides high gain while the thick channel layer in the access regions (particularly in the drain access region) provides good dispersion control (i.e., minimizes dispersion) under high power operation. The structure of transistor 600B may be optimal for use in a low-noise amplifier (LNA). Similar to a PA, an LNA requires transistors with high gain, which is obtained by transistor 600B as a result of the small gate-to-channel separation. However, in an LNA dispersion control is not as important as in a PA, but lower capacitance to give higher gain and a lower noise figure is desirable. This is achieved in transistor 600B by means of a thinner channel layer in the access regions. The structure of transistor 600C may be optimal for use in an RF switch, since the larger gate-to-channel separation (relative to transistors 600A and 600B) increases the channel conductivity and maximum device current while also allowing for a longer gate length, which may result in higher yield, and the thick channel layer in the access regions provides good dispersion control under high current operation.

Figure 7:
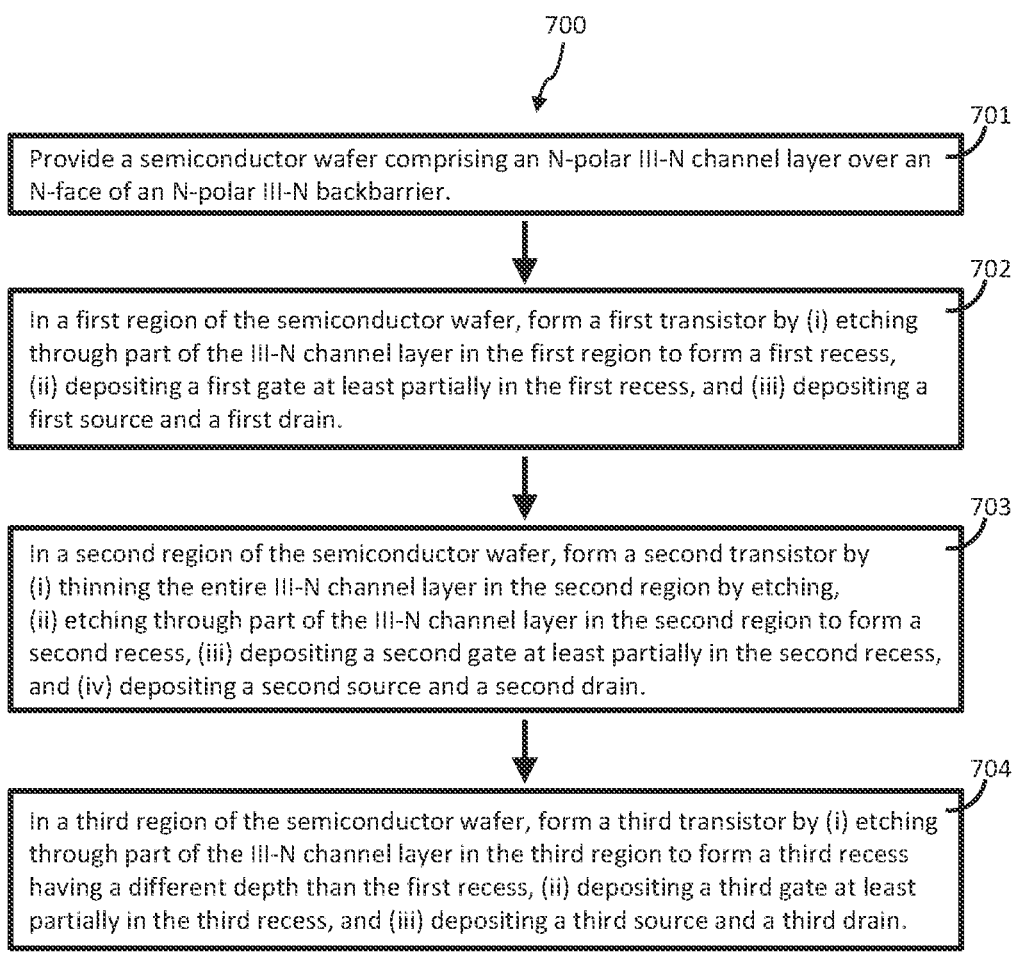
FIG. 7 shows a method of forming a semiconductor device.

A method 700 of forming a semiconductor device (e.g., device 400) with monolithically integrated transistors 600A, 600B, and/or 600C is shown in FIG. 7. First, a semiconductor wafer comprising a III-N material structure is formed or provided, where the III-N material structure includes an N-polar III-N channel layer over an N-face of an N-polar III-N backbarrier (step 701). The III-N material structure can be the same as that shown in FIG. 5. A first transistor (e.g., transistor 600A) is formed in a first region of the semiconductor wafer by (i) etching through part of the III-N channel layer to form a first recess, (ii) depositing a first gate at least partially in the first recess, and (iii) depositing a first source and a first drain on opposite sides of the first gate (step 702). A second transistor (e.g., transistor 600B) is formed in a second region of the semiconductor wafer by (i) thinning the entire III-N channel layer in the second region by etching, (ii) etching through part of the III-N channel layer in the second region to form a second recess, (iii) depositing a second gate at least partially in the second recess, and (iv) depositing a second source and a second drain on opposite sides of the second gate (step 703). A third transistor (e.g., transistor 600C) is formed in a third region of the semiconductor wafer by (i) etching through part of the III-N channel layer in the third region to form a third recess having a different depth than the first recess, (ii) depositing a third gate at least partially in the third recess, and (iii) depositing a third source and a third drain on opposite sides of the third gate (step 704). In some implementations, the gates of two or more of the transistors are deposited simultaneously, and/or the sources and drains of two or more of the transistors are deposited simultaneously, and/or the gate recesses of two or more of the transistors are at least partially formed (e.g., by etching) simultaneously, and/or thinning the III-N channel layer in one transistor and forming a gate recess in another transistor are performed simultaneously (e.g., by etching both simultaneously).

The monolithically integrated semiconductor device 400 and the method of forming device 400 described above are made possible by the fact that in N-polar III-N transistors the (back)barrier is below the channel layer. Accordingly, unlike in a group-III polar III-N transistor, the thickness of the channel layer in the access regions can be readily varied by etching the (uncovered) channel layer, thereby allowing of the formation of both transistor 600A and transistor 600B from a single common epitaxial material structure. Furthermore, in an N-polar transistor, thinning the semiconductor material (e.g., by etching) to form transistor 600B from the same epitaxial materials as transistor 600A may not substantially alter the 2DEG charge density in the access regions, thereby allowing transistor 600B to maintain a low on-resistance. In a group-III polar transistor, thinning the semiconductor material by etching would result in a thinner barrier layer (and not a thinner channel layer) in the device access regions, which may cause a substantial reduction in the 2DEG charge density in the access regions, thereby resulting in increased on-resistance and a lower maximum current density during device operation.

Figure 8:
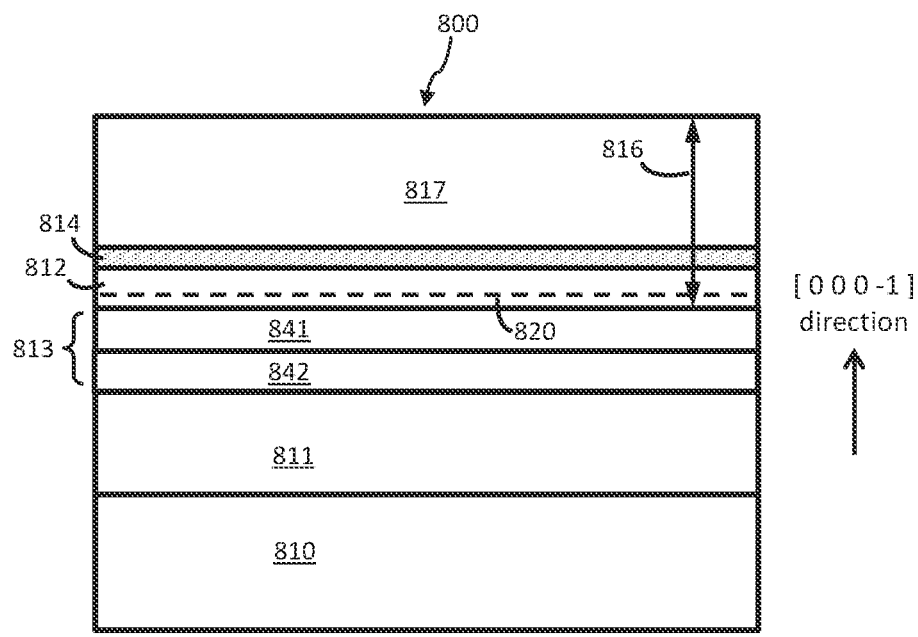
FIG. 8 is a cross-sectional view of another epitaxially formed N-polar III-N material structure.

Although not shown in FIG. 5, 6A, 6B, or 6C, transistors 600A, 600B, and 600C may each further include a dielectric layer formed over the upper surface of the transistor that functions as a passivation layer. In some implementations, the same dielectric layer is formed over all 3 transistors, where a first portion of the dielectric layer is over transistor 600A, a second portion of the dielectric layer is over transistor 600B, and a third portion of the dielectric layer is over transistor 600C. The first portion of the dielectric layer may optionally be thicker than the second portion of the dielectric layer. Having a thicker dielectric layer may provide better passivation and dispersion control, which is generally preferable. However, when transistor 600B is used in an LNA, a thinner passivation layer can result in higher gain. Because dispersion control may not be as critical in an LNA as in a PA, in some cases the overall device performance may be improved if the first portion of the dielectric layer is thicker than the second portion of the dielectric layer FIG. 8 is a cross-sectional view of another epitaxially formed N-polar III-N material structure 800 from which semiconductor wafer 410 of FIG. 4 can be formed, and FIGS. 9A, 9B, 9C, 9D and 9E show the resulting monolithically integrated transistor structures 900A, 900B, 900C, 900D, and 900E, respectively, that can be obtained from material structure 800. Similar to material structure 500 of FIG. 5, material structure 800 includes a substrate 810 and a plurality of III-N layers in an N-polar orientation (i.e., in the [0 0 0 –1] direction, as shown) on the substrate 810. Substrate 810 can be the same as substrate 510 of material structure 500. The plurality of N-polar III-N layers on substrate 810 may include a III-N buffer layer 811, a III-N backbarrier 813, and a III-N channel layer 812. The compositions of layers 811, 813, and 812 may be the same as those of layers 511, 513, and 512, respectively.

Material structure 800 further includes a III-N etch stop layer 814 over the N-face of the III-N channel layer 812 and a III-N cap layer 817 over the N-face of the III-N etch stop layer 814. The total thickness 816 of the III-N channel layer 812, III-N etch stop layer 814, and III-N cap layer 817 in material structure 800 can be similar to or about the same as the thickness 516 of the III-N channel layer 512 in material structure 500. The compositions of III-N cap layer 817 and III-N etch stop layer 814 can be selected such that III-N cap layer 817 can be selectively etched at a higher rate than III-N etch stop layer 814 using an etch process suitable for forming a gate recess such as a F-containing plasma or an HCl-containing aqueous solution. For example, III-N cap layer 817 can be formed of GaN and III-N etch stop layer 814 can be formed of $Al_yGa_{1-y}N$, where the aluminum fractional composition y can be in the range of $0 < y \le 1$ (e.g., in the range of $0.05 \le y \le 0.6$). The bandgap of the III-N etch stop layer 814 may be greater than the bandgap of the III-N cap layer 817. The bandgap and/or the composition of the III-N cap layer 817 may be the same as or about the same as that of the III-N channel layer 812. In some implementations, the III-N etch stop layer 814 is formed of $Al_yGa_{1-y}N$ ($0 < y \le 1$), and the III-N channel layer 812 and the III-N cap layer 817 are both formed of GaN.

Figure 9A:
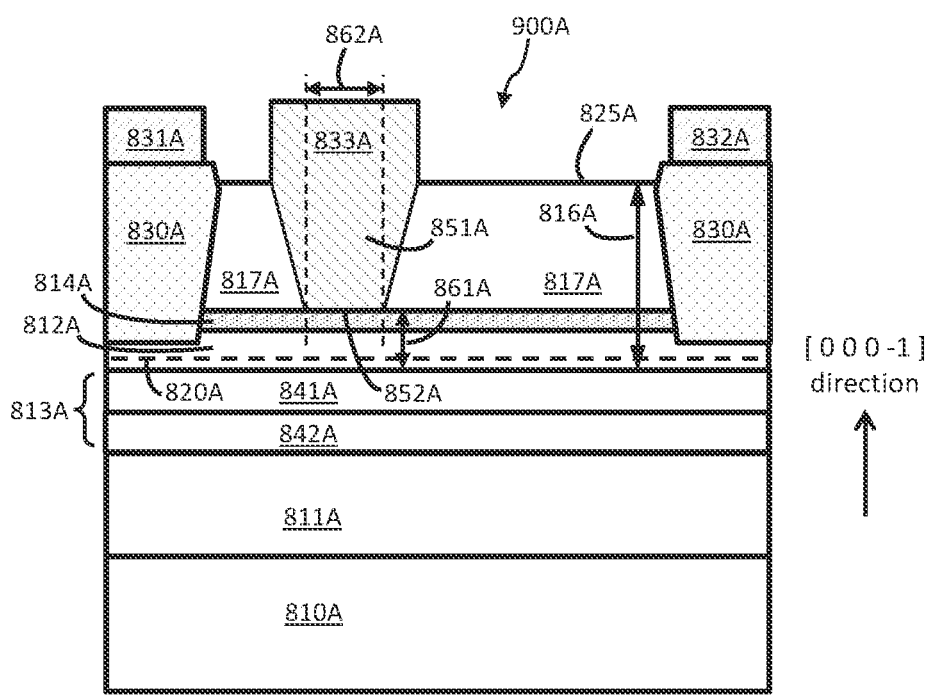
FIGS. 9A, 9B, 9C, 9D, and 9E are cross-sectional views of other N-polar III-N transistor structures that can be monolithically integrated and used in the semiconductor device of FIG. 4.

Referring now to FIG. 9A, transistor 900A includes a first portion 813A of III-N backbarrier 813 (i.e., the portion of backbarrier 813 that is in the first region 420A of semiconductor wafer 410) and a first portion 812A of III-N channel layer 812, where portion 812A of the channel layer has a first 2DEG channel 820A therein. Transistor 900A further includes a first portion 814A of III-N etch stop layer 814 and a first portion 817A of III-N cap layer 817. The first portion 817A of the III-N cap layer has a first recess 851A formed therein adjacent to its N-face 825A, the first recess having a first bottom surface 852A. The first recess 851A extends at least partially through the thickness of the first portion 817A of the III-N cap layer. In some implementations, the first recess 851A extends through the entire thickness of the first portion 817A of the III-N cap layer, but does not extend into the first portion 812A of the III-N channel layer.

The first recess 851A can be formed by etching into the first portion 817A of the III-N cap layer using an etch process that etches the material of the III-N cap layer at a higher rate than that of the III-N etch stop layer 814A. Accordingly, the etch can be made to "stop" at or near the surface of etch stop layer 814A that is adjacent to III-N cap layer 817. As such, the depth of the first recess 851A, and the corresponding separation 861A between bottom surface 852A of the first recess 851A and the group-III face of the first portion 813A of the III-N backbarrier, can be controlled epitaxially. This can result in improved uniformity and/or reproducibility as compared to transistor 600A. While etch stop layers can provide precise control of depths and smooth etched surfaces, residual byproducts, such as fluorine ions, from the selective etch remaining in the near-surface region may cause undesirable electrical instabilities, with similar behavior having been observed for N-polar transistors fabricated using $SF_6$ based plasma etch. Removal of the near-surface region by means of additional etching using plasma etches and/or wet chemical etches that do not leave residual F can remove these instabilities.

Transistor 900A further includes a first gate 833A that is formed of a metal or other conductive material and is at least partially in the first recess 851A. Transistor 900A also includes a first source 831A and a first drain 832A that are each formed of a metal or other conductive material and are positioned such that the first gate 833A is between the first source 831A and the first drain 832A. A regrown n+ region 830A is optionally formed beneath each of the source contact 831A and the drain contact 832A to reduce the contact resistance between the source/drain contacts and the first 2DEG channel 820A.

Figure 9B:
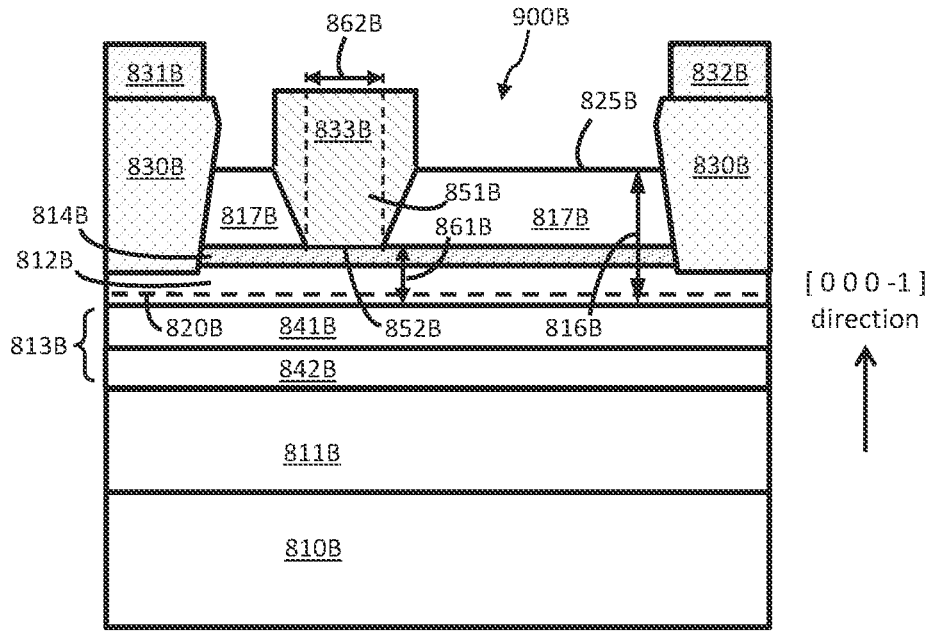

Referring to FIG. 9B, transistor 900B includes a second portion 813B of III-N backbarrier 813 (i.e., the portion of backbarrier 813 that is in the second region 420B of semiconductor wafer 410) and a second portion 812B of III-N channel layer 812, where portion 812B of the channel layer has a second 2DEG channel 820B therein. Transistor 900B further includes a second portion 814B of III-N etch stop layer 814 and a second portion 817B of III-N cap layer 817, where the second portion 817B of the III-N cap layer in transistor 900B is thinner than the first portion 817A of the III-N cap layer in transistor 900A. The second portion 817B of the III-N cap layer has a second recess 851B formed therein adjacent to its N-face 825B, the second recess having a first bottom surface 852B. The second recess 851B extends at least partially through the thickness of the second portion 817B of the III-N cap layer. In some implementations, the second recess 851B extends through the entire thickness of the second portion 817B of the III-N cap layer, but does not extend into the second portion 812B of the III-N channel layer.

Transistor 900B further includes a second gate 833B that is formed of a metal or other conductive material and is at least partially in the second recess 851B. Transistor 900B also includes a second source 831B and a second drain 832B that are each formed of a metal or other conductive material and are positioned such that the second gate 833B is between the second source 831B and the second drain 832B. A regrown n+ region 830B is optionally formed beneath each of the second source 831B and the second drain 832B to reduce the contact resistance between the second source/drain contacts and the second 2DEG channel 820B.

Transistor 900B is similar to transistor 600B in that it can be formed by thinning the second portion 817B of the III-N cap layer (e.g., by etching) and then subsequently forming a transistor that is the same as transistor 900A, except that the total thickness 816B of layers 812B, 814B, and 817B in the access regions of transistor 900B is less than the total thickness 816A of layers 812A, 814A, and 817A in the access regions of transistor 900A. Similar to transistor 900A, the separation 861B between bottom surface 852B of the second recess 851B and the group-III face of the second portion 813B of the III-N backbarrier can be controlled epitaxially by using an etch process for the gate recess that etches the material of the III-N cap layer 817 at a higher rate than the material of the III-N etch stop layer 814. In some implementations, thickness 816A is greater than 1.1 times (e.g., greater than 1.2 times, greater than 1.3 times, greater than 1.4 times, greater than 1.5 times, greater than 1.6 times, greater than 1.8 times, or greater than 2 times) that of thickness 816B. In some implementations, the thickness of the first portion 817A of the III-N cap layer in a region between the first gate 833A and the first drain 832A of transistor 900A is greater than 1.1 times (e.g., greater than 1.2 times, greater than 1.3 times, greater than 1.4 times, greater than 1.5 times, greater than 1.6 times, greater than 1.8 times, or greater than 2 times) the thickness of the second portion 817B of the III-N cap layer in a region between the second gate 833B and the second drain 832B of transistor 900B.

Figure 9C:
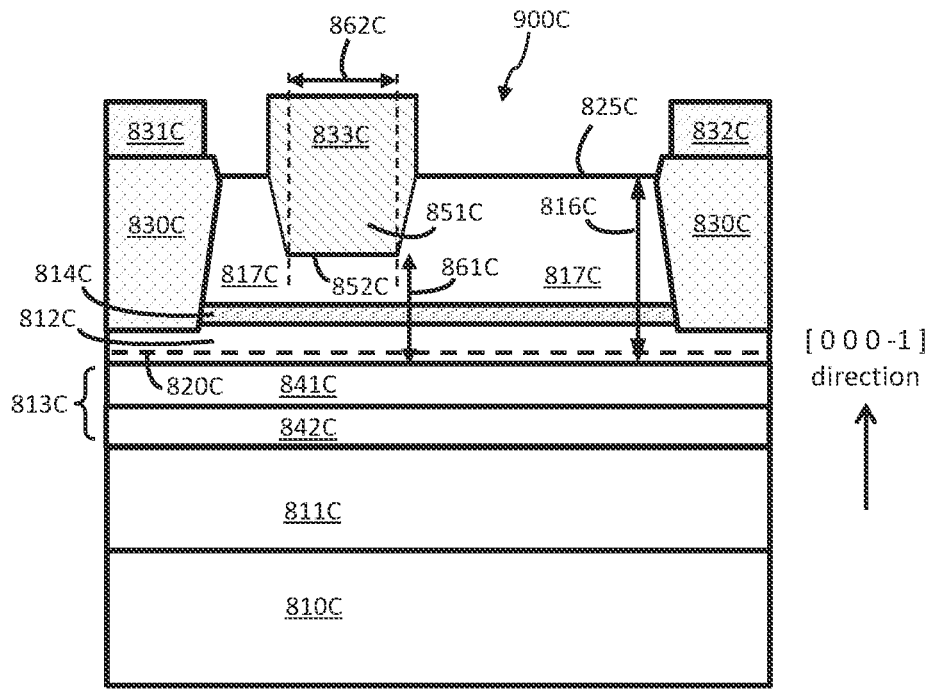

Referring now to FIG. 9C, similar to transistors 900A and 900B, transistor 900C includes a third portion 813C of III-N backbarrier 813 (i.e., the portion of backbarrier 813 that is in the third region 420C of semiconductor wafer 410), a third portion 812C of channel layer 812, where portion 812C of the channel layer has a third 2DEG channel 520C therein, a third portion 814C of III-N etch stop layer 814, and a third portion 817C of III-N cap layer 817. Also similar to transistors 900A and 900B, in transistor 900C the third portion 817C of the III-N cap layer has a third recess 851C formed therein adjacent to its N-face 825C, the third recess having a third bottom surface 852C. The third recess 851C can be formed by etching into the third portion 817C of the III-N cap layer. Transistor 900C further includes a third gate 833C that is formed of a metal or other conductive material and is at least partially in the third recess 851C. Transistor 900C also includes a third source 831C and a third drain 832C that are each formed of a metal or other conductive material and are positioned such that the third gate 833C is between the third source 831C and the third drain 832C. A regrown n+ region 830C is optionally formed beneath each of the third source 831C and the third drain 832C to reduce the contact resistance between the third source/drain contacts and the third 2DEG channel 820C.

Similar to the case of transistor 600C, in transistor 900C a smaller thickness of the III-N cap layer 817C is removed to form the third recess 851C as compared to the thickness of cap layer 817A removed to form the first recess 851A in transistor 900A. Consequently, the separation 861C between bottom surface 852C of the third recess 851C and the group-III face of the third portion 813C of the III-N backbarrier in transistor 900C is greater than the separation 861A between bottom surface 852A of the first recess 851A and the group-III face of the first portion 813A of the III-N backbarrier in transistor 900A. Separation 861C can, for example, be greater than 1.1 times, greater than 1.2 times, greater than 1.3 times, greater than 1.4 times, greater than 1.5 times, greater than 1.6 times, greater than 1.8 times, or greater than 2 times separation 861A. Optionally, the gate length 862C of transistor 900C can be larger than the gate length 562A of transistor 900A, for example larger than 1.1 times, 1.2 times, 1.3 times, 1.4 times, 1.5 times, 1.6 times, 1.8 times, 2 times, 2.5 times, or 3 times the gate length 862A of transistor 900A.

Figure 9D:
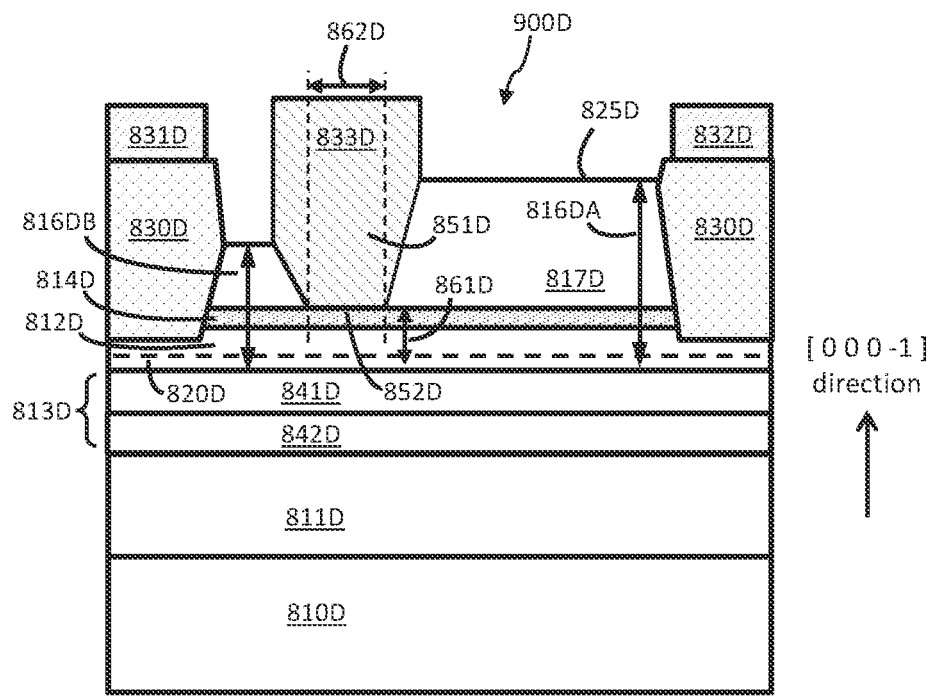

Referring now to FIG. 9D, transistor 900D is similar to transistor 900B, except that instead of thinning the entire cap layer 817D prior to forming recess 851D, the cap layer is thinned in the source access region (i.e., between the source 831D and the gate 833D) but is not thinned in the drain access region (i.e., between the drain 832D and the gate 833D). Accordingly, the total thickness 816DA of layers 817D, 814D, and 812D in the drain access region can be the same as thickness 816A in FIG. 8A, and the total thickness 816DB of layers 817D, 814D, and 812D in the source access region can be smaller than thickness 816DA. In some cases, the thickness 816DB can be substantially the same as thickness 816B in FIG. 6B. In some implementations, separation 861C in transistor 900C is about the same as the thickness 816B in transistor 900B. For example, thickness 816B can be between 0.9 times thickness 861C and 1.1 times separation 861C. Having these two thicknesses be about the same allows the same etch to be used for forming both recess 851C in transistor 900C and for thinning cap layer 817B in transistor 900B when the two devices are monolithically integrated on the same wafer, thereby simplifying the fabrication process. For similar reasons, thickness 816DB in the source access region of transistor 900D can be about the same as separation 861C in transistor 900C. That is, thickness 816DB can be between 0.9 times separation 861C and 1.1 times separation 861C.

Figure 9E:
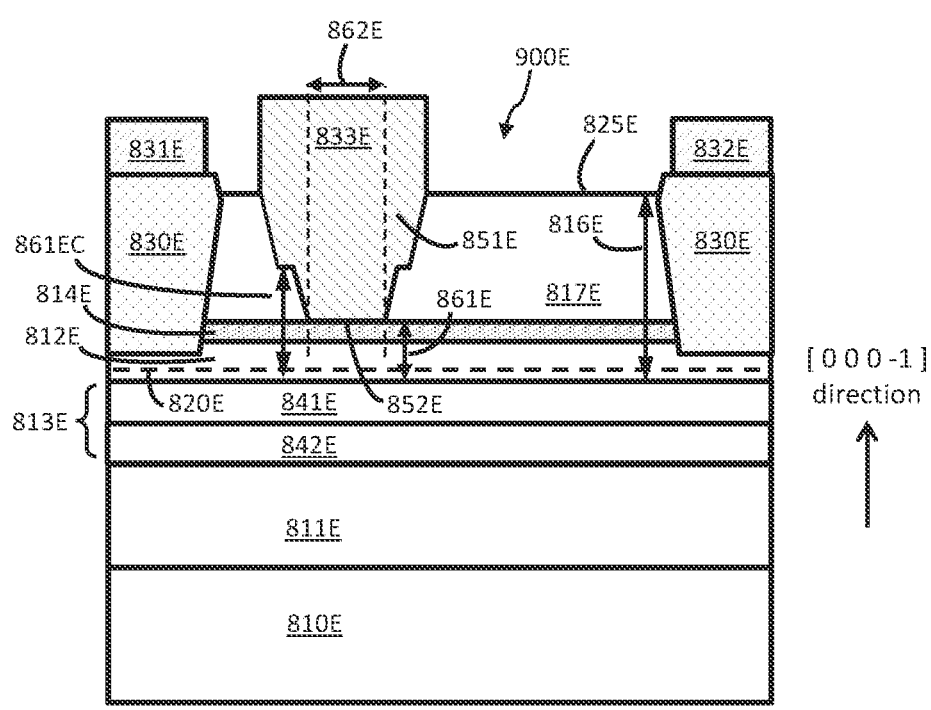

Referring now to FIG. 9E, transistor 900E is the same as transistor 900A, except that the shape of the recess 851E for transistor 900E is different than that of transistor 900A. Specifically, recess 851E includes one or more steps, as shown. Recess 851E can be formed in multiple steps. First, the upper part of the recess (i.e., above the step) can be formed by etching down to the depth of the step. A second etch can then be carried out to form the bottom part of recess 851E. In some implementations, the etch that forms the upper part of recess 851E is the same as the etch used to form recess 851C in transistor 900C (i.e., the upper portion of recess 851E and recess 851C are formed simultaneously). Accordingly, the separation 861EC between the step and the interface between layers 812E and 841E in transistor 900E can be about the same as separation 861C in transistor 900C. For example, separation 861EC can be between 0.9 times separation 861C and 1.1 times separation 861C.

For the same reasons cited above with respect to transistors 600A, 600B, 600C, 600D, and 600E, the structure of any of transistors 900A, 900D, or 900E may be optimal for use in a power amplifier (PA), the structure of transistor 900B may be optimal for use in a low-noise amplifier (LNA), and the structure of transistor 900C may be optimal for use in an RF switch. Furthermore, because the depths of the gate recesses for transistors 900A and 900B are determined by the thickness of the epitaxially grown cap layer 817, the reproducibility and yield for these transistors may be improved as compared to that for transistors 600A and 600B.

Figure 10:
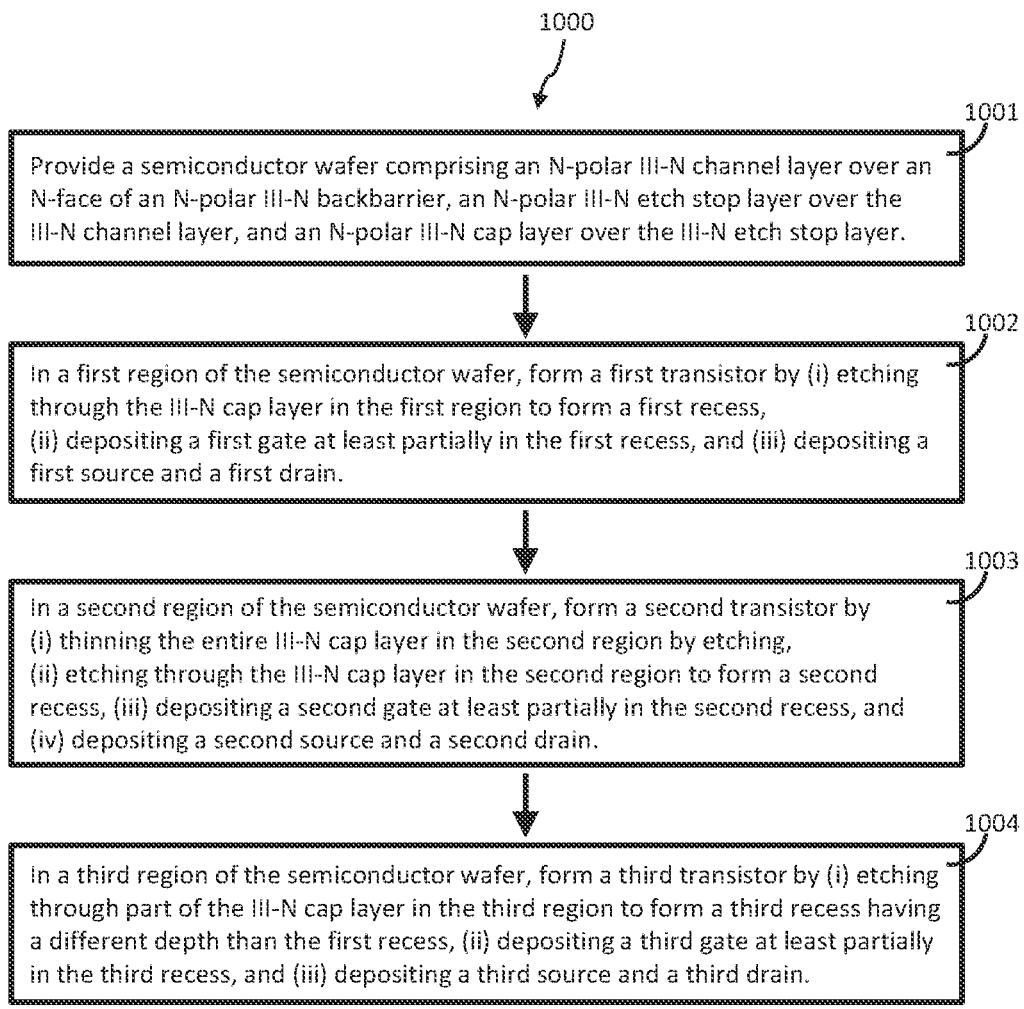
FIG. 10 shows another method of forming a semiconductor device.

A method 1000 of forming a semiconductor device (e.g., device 400) with monolithically integrated transistors 900A, 900B, and/or 900C is shown in FIG. 10. First, a semiconductor wafer comprising a III-N material structure is formed or provided, where the III-N material structure includes an N-polar III-N channel layer over an N-face of an N-polar III-N backbarrier, an N-polar III-N etch stop layer over the III-N channel layer, and an N-polar III-N cap layer over the III-N etch stop layer (step 1001). The III-N material structure can be the same as that shown in FIG. 8. A first transistor (e.g., transistor 900A) is formed in a first region of the semiconductor wafer by etching through the III-N cap layer in the first region to form a first recess, depositing a first gate at least partially in the first recess, and depositing a first source and a first drain on opposite sides of the first gate (step 1002). A second transistor (e.g., transistor 900B) is formed in a second region of the semiconductor wafer by thinning the entire III-N cap layer in the second region by etching, etching through the III-N cap layer in the second region to form a second recess, depositing a second gate at least partially in the second recess, and depositing a second source and a second drain on opposite sides of the second gate (step 1003). A third transistor (e.g., transistor 900C) is formed in a third region of the semiconductor wafer by etching through part of the III-N cap layer in the third region to form a third recess having a different depth than the first recess, depositing a third gate at least partially in the third recess, and depositing a third source and a third drain on opposite sides of the third gate (step 1004). In some implementations, the gates of two or more of the transistors are deposited simultaneously, and/or the sources and drains of two or more of the transistors are deposited simultaneously, and/or the gate recesses of two or more of the transistors are at least partially formed (e.g., by etching) simultaneously, and/or thinning the III-N channel layer in one transistor and forming a gate recess in another transistor are performed simultaneously (e.g., by etching both simultaneously).

Similar to transistors 600A, 600B, 600C, 600D, and 600E, although not shown in FIG. 8, 9A, 9B, 9C, 9D, or 9E, transistors 900A, 900B, 900C, 900D, and 900E may each further include a dielectric layer formed over the upper surface of the transistor that functions as a passivation layer. The thicknesses and other properties of the dielectric layer may be the same as that described with respect to transistors 600A, 600B, and 600C.

Figure 11:
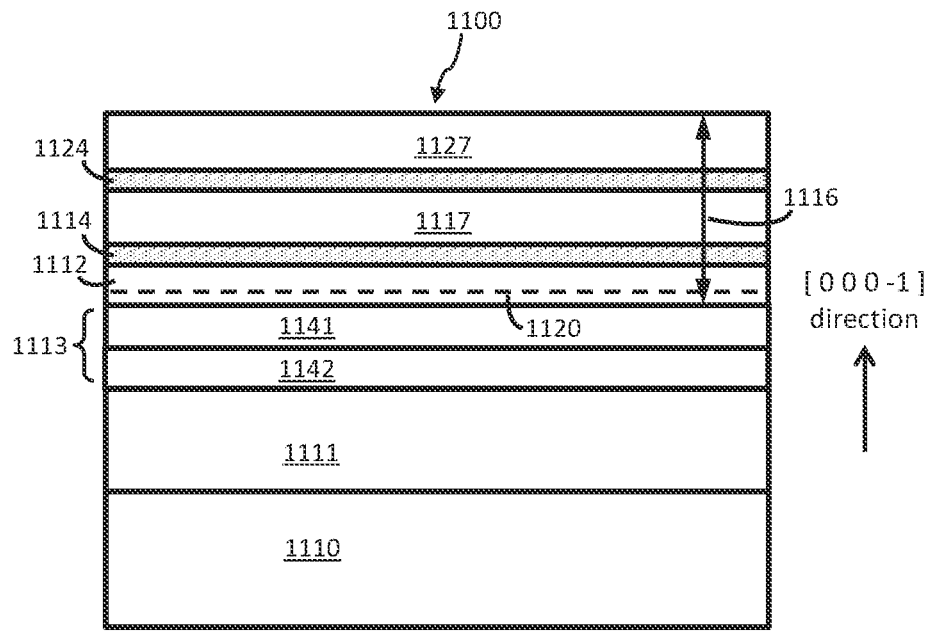
FIG. 11 is a cross-sectional view of another epitaxially formed N-polar III-N material structure.
Figure 12A:
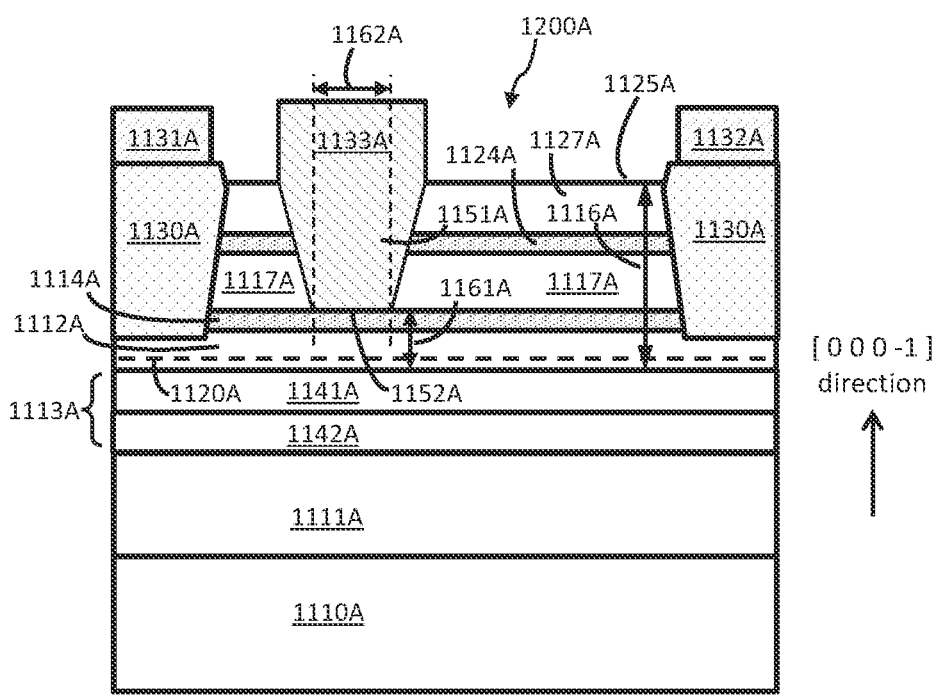
FIGS. 12A, 12B, and 12C are cross-sectional views of other N-polar III-N transistor structures that can be monolithically integrated and used in the semiconductor device of FIG. 4.
Figure 12B:
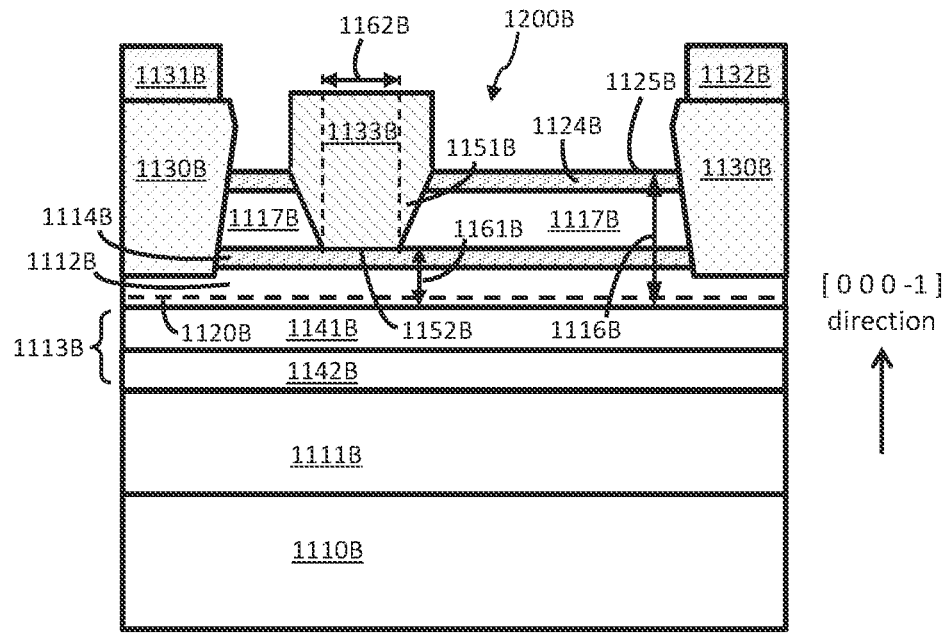
Figure 12C:
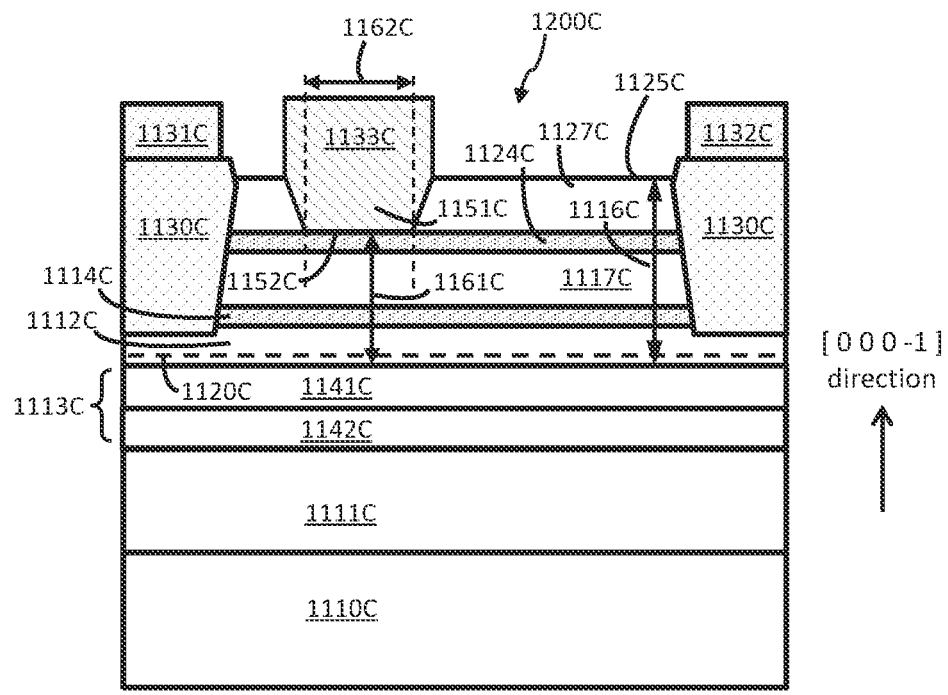

FIG. 11 is a cross-sectional view of another epitaxially formed N-polar III-N material structure 1100 from which semiconductor wafer 410 of FIG. 4 can be formed, and FIGS. 12A, 12B, and 12C show the resulting monolithically integrated transistor structures 1200A, 1200B, and 1200C, respectively, that can be obtained from material structure 1100. Similar to material structure 800 of FIG. 8, material structure 1100 includes a substrate 1110 and a plurality of III-N layers in an N-polar orientation (i.e., in the [0 0 0 –1] direction, as shown) on the substrate 1110. Substrate 1110 can be the same as substrate 510 of material structure 500. The plurality of N-polar III-N layers on substrate 1110 may include a III-N buffer layer 1111, a III-N backbarrier 1113, a III-N channel layer 1112, a first III-N etch stop layer 1114, and a first III-N cap layer 1117. The compositions of layers 1111, 1113, 1112, 1114, and 1117 may be the same as those of layers 811, 813, 812, 814, and 817, respectively.

Material structure 1100 further includes a second III-N etch stop layer 1124 over the N-face of the first III-N cap layer 1117 and a second III-N cap layer 1127 over the N-face of the second III-N etch stop layer 1124. The total thickness 1116 of the III-N layers 1112, 1114, 1117, 1124, 1127 in material structure 1100 can be similar to or about the same as the thickness 816 in material structure 800. The compositions of the first and second III-N cap layers 1117 and 1127, respectively, and of the first and second III-N etch stop layers 1114 and 1124, respectively, can be selected such that III-N cap layers 1117 and 1127 can each be selectively etched at a higher rate than the III-N etch stop layers 1114 and 1124 using an etch process suitable for forming a gate recess. For example, III-N cap layers 1117 and 1127 can each be formed of GaN, and III-N etch stop layers 1114 and 1124 can each be formed of $Al_yGa_{1-y}N$, where the aluminum fractional composition y can be in the range of $0<y\le1$ (e.g., in the range of $0.1\le y\le 0.6$). The bandgap of each of the III-N etch stop layers may be greater than the bandgap of each of the III-N cap layers. The bandgap and/or the composition of each of the III-N cap layers may be the same as or about the same as that of the III-N channel layer 1112. In some implementations, the III-N etch stop layers 1114 and 1117 are each formed of $Al_yGa_{1-y}N$ ($0<y\le1$), and the III-N channel layer 1112 and each of the III-N cap layers 1117 and 1127 are all formed of GaN.

Referring now to FIG. 12A, transistor 1200A is similar to transistor 900A of FIG. 9A, except that the first recess 1151A is formed through both III-N cap layers 1117A and 1127A and through the second etch stop layer 1124A. As with transistor 900A, the etch used to form the first recess 1151A can be made to "stop" at or near the surface of the first etch stop layer 1114C that is adjacent to the first III-N cap layer 1117C. As such, the depth of the first recess 1151A, and the corresponding separation 1161A between bottom surface 1152A of the first recess 1151A and the group-III face of the first portion 1113A of the III-N backbarrier, can be controlled epitaxially.

Referring to FIG. 12B, transistor 1200B is similar to transistor 900B of FIG. 9B, except that the entire second III-N cap layer (layer 1127 in FIG. 11) is removed (e.g., by etching) in the second region (the region of the wafer in which transistor 1200B is formed), and the second recess 1151B is formed through layers 1124B and 1117B. In forming transistor 1200B, the second III-N etch stop layer 1124B can function as an etch stop for removal of the second III-N cap layer, and the first III-N etch stop layer can function as an etch stop for forming the second recess 1151B.

Referring to FIG. 12C, transistor 1200C is similar to transistor 900C of FIG. 9C, except that the third recess 1151C is formed through the second III-N cap layer 1127C and can be made to "stop" at or near the surface of the second etch stop layer 1124C that is adjacent to the second III-N cap layer 1127C. As such, the depth of the third recess 1151C, and the corresponding separation 1161C between bottom surface 1152C of the third recess 1151C and the group-III face of the first portion 1113C of the III-N backbarrier, can be controlled epitaxially.

Similar to the case of transistors 900A, 900B, and 900C, the separation 1161A between bottom surface 1152A of the first recess 1151A and the group-III face of the first portion 1113A of the III-N backbarrier in transistor 1200A is greater than the separation 1161C between bottom surface 1152C of the third recess 1151C and the group-III face of the third portion 1113C of the III-N backbarrier in transistor 1200C. Separation 1161A can, for example, be greater than 1.1 times, greater than 1.2 times, greater than 1.3 times, greater than 1.4 times, greater than 1.5 times, greater than 1.6 times, greater than 1.8 times, or greater than 2 times separation 1161C. Optionally, the gate length 1162C of transistor 1200C can be larger than the gate length 1162A of transistor 1200A, for example larger than 1.1 times, 1.2 times, 1.3 times, 1.4 times, 1.5 times, 1.6 times, 1.8 times, 2 times, 2.5 times, or 3 times the gate length 1162A of transistor 1200A.

For the same reasons cited above with respect to transistors 900A, 900B, and 900C, the structure of transistor 1200A may be optimal for use in a power amplifier (PA), the structure of transistor 1200B may be optimal for use in a low-noise amplifier (LNA), and the structure of transistor 1200C may be optimal for use in an RF switch. Furthermore, because the depths of the gate recesses for all three transistors are determined by the thickness of epitaxially layers, the reproducibility and yield for these transistors may be even further improved as compared to that for transistors 900A, 900B, and 900C.

Figure 13:
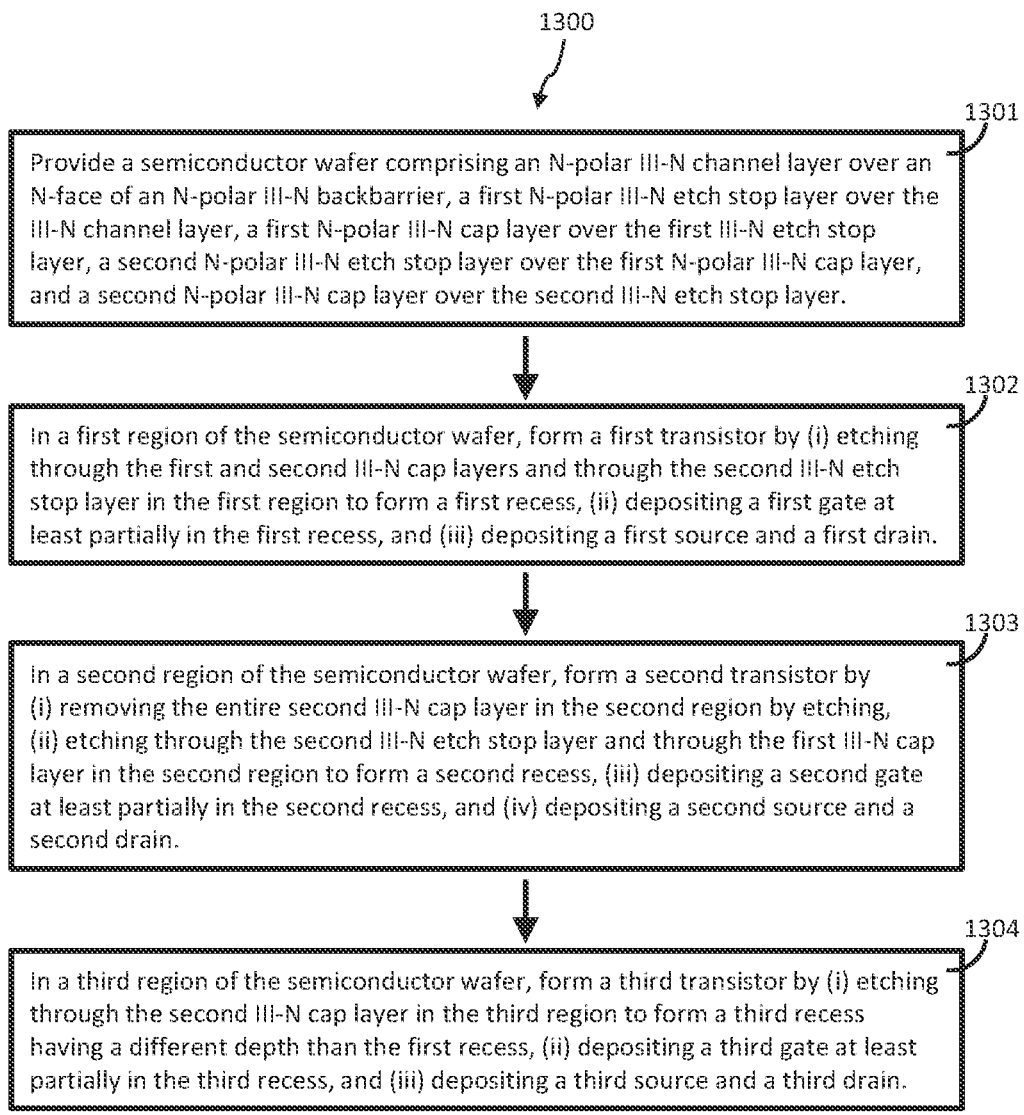
FIG. 13 shows another method of forming a semiconductor device.

A method 1300 of forming a semiconductor device (e.g., device 400) with monolithically integrated transistors 1200A, 1200B, and/or 1200C is shown in FIG. 13. First, a semiconductor wafer comprising a III-N material structure is formed or provided, where the III-N material structure includes an N-polar III-N channel layer over an N-face of an N-polar III-N backbarrier, a first N-polar III-N etch stop layer over the III-N channel layer, a first N-polar III-N cap layer over the first III-N etch stop layer, a second N-polar III-N etch stop layer over the first III-N cap layer, and a second N-polar III-N cap layer over the second III-N etch stop layer (step 1301). The III-N material structure can be the same as that shown in FIG. 11. A first transistor (e.g., transistor 1200A) is formed in a first region of the semiconductor wafer by etching through the first and second III-N cap layers and through the second III-N etch stop layer in the first region to form a first recess, depositing a first gate at least partially in the first recess, and depositing a first source and a first drain on opposite sides of the first gate (step 1302). A second transistor (e.g., transistor 1200B) is formed in a second region of the semiconductor wafer by removing the entire second III-N cap layer in the second region by etching, etching through the second III-N etch stop layer and through the first III-N cap layer in the second region to form a second recess, depositing a second gate at least partially in the second recess, and depositing a second source and a second drain on opposite sides of the second gate (step 1303). A third transistor (e.g., transistor 1200C) is formed in a third region of the semiconductor wafer by etching through the second III-N cap layer in the third region to form a third recess having a different depth than the first recess, depositing a third gate at least partially in the third recess, and depositing a third source and a third drain on opposite sides of the third gate (step 1304). In some implementations, the gates of two or more of the transistors are deposited simultaneously, and/or the sources and drains of two or more of the transistors are deposited simultaneously.

Similar to transistors 600A, 600B, and 600C, although not shown in FIG. 11, 12A, 12B, or 12C, transistors 1200A, 1200B, and 1200C may each further include a dielectric layer formed over the upper surface of the transistor that functions as a passivation layer. The thicknesses and other properties of the dielectric layer may be the same as that described with respect to transistors 600A, 600B, and 600C.

Figure 14A:
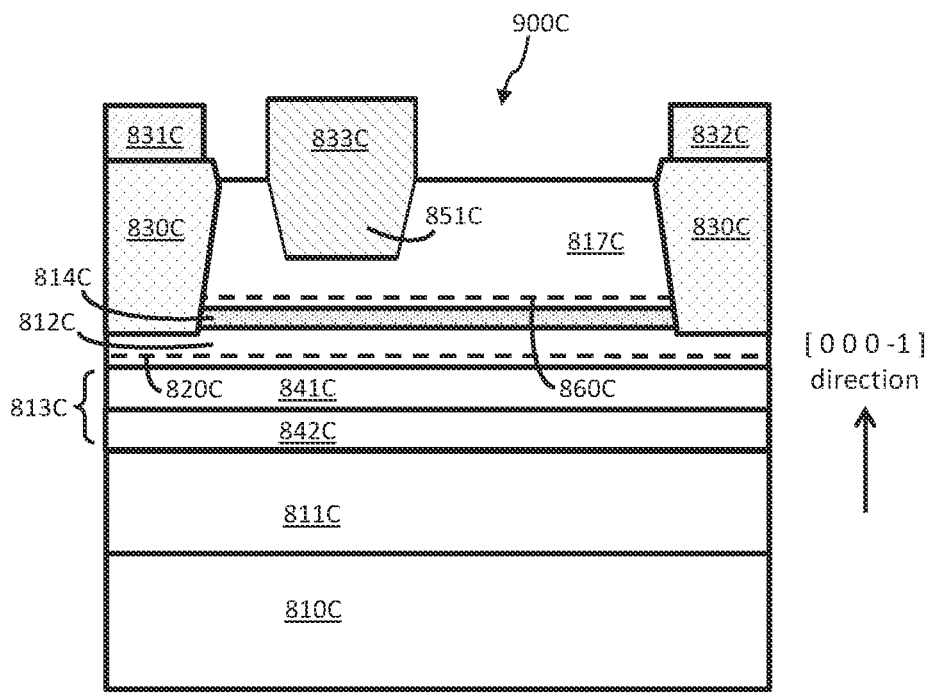
FIGS. 14A and 14B are cross-sectional views of N-polar III-N transistor structures in which one or more secondary 2DEGs are formed.
Figure 14B:
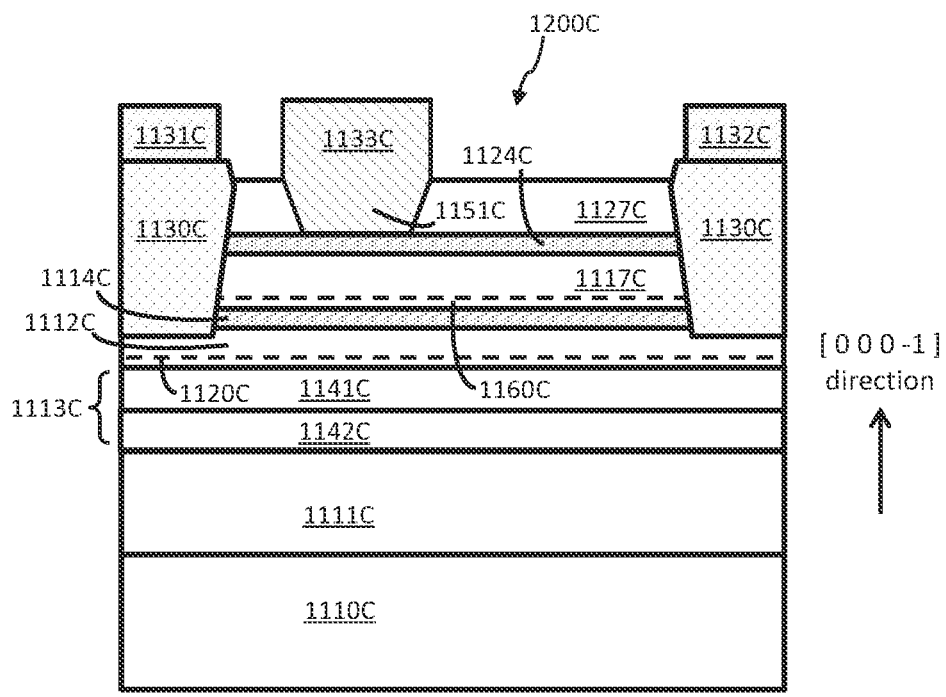

Depending on the specific compositions and thicknesses of the etch stop layers and cap layers in the transistors described above, one or more secondary 2DEGs may be formed in the III-N cap layer(s) of the transistor. For example, FIG. 14A shows the position of secondary 2DEG 860C that can be induced in the III-N cap layer 817C of transistor 900C (from FIG. 9C), and FIG. 14B shows the position of secondary 2DEG 1160C that can be induced in the first III-N cap layer 1117C of transistor 1200C (from FIG. 12C). The secondary 2DEGs 860C and 1160C may extend continuously from the source region to the drain region and may be beneath the gate of each of their respective transistors when the transistor is biased ON (i.e., when the gate-source voltage is greater than the threshold voltage of the transistor). In transistors such as the RF switches of FIGS. 14A and 14B, this secondary 2DEG can increase the total channel conductivity of the transistor, thereby improving the switch performance, although a larger gate voltage swing may be required to switch the transistor from the ON state to the OFF state.

Figure 15:
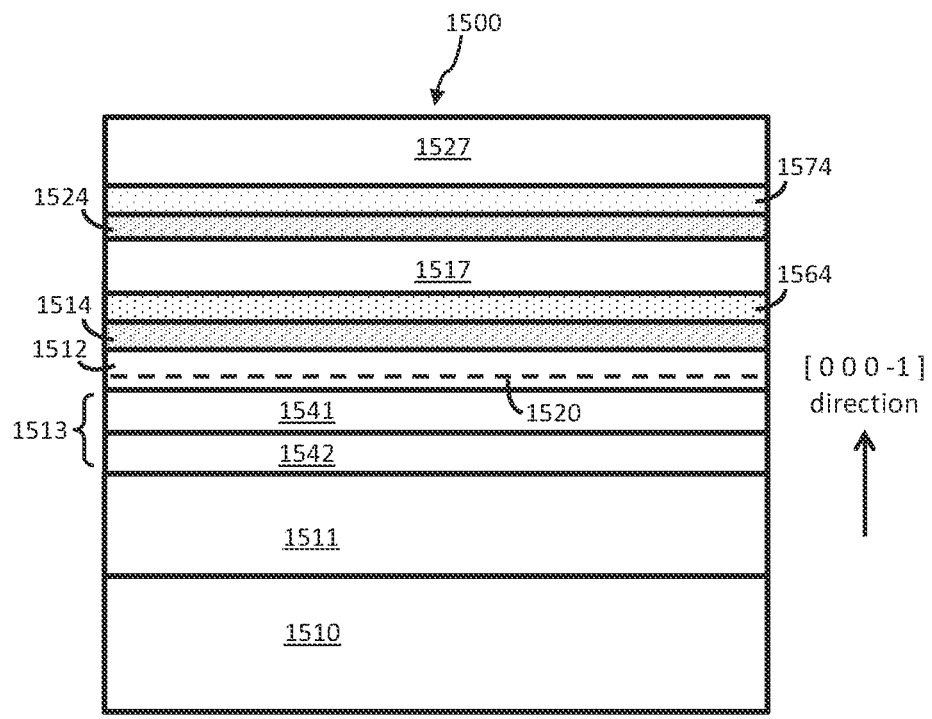
FIG. 15 is a cross-sectional view of an epitaxially formed N-polar III-N material structure that includes one or more p-type III-N layers.
Figure 16:
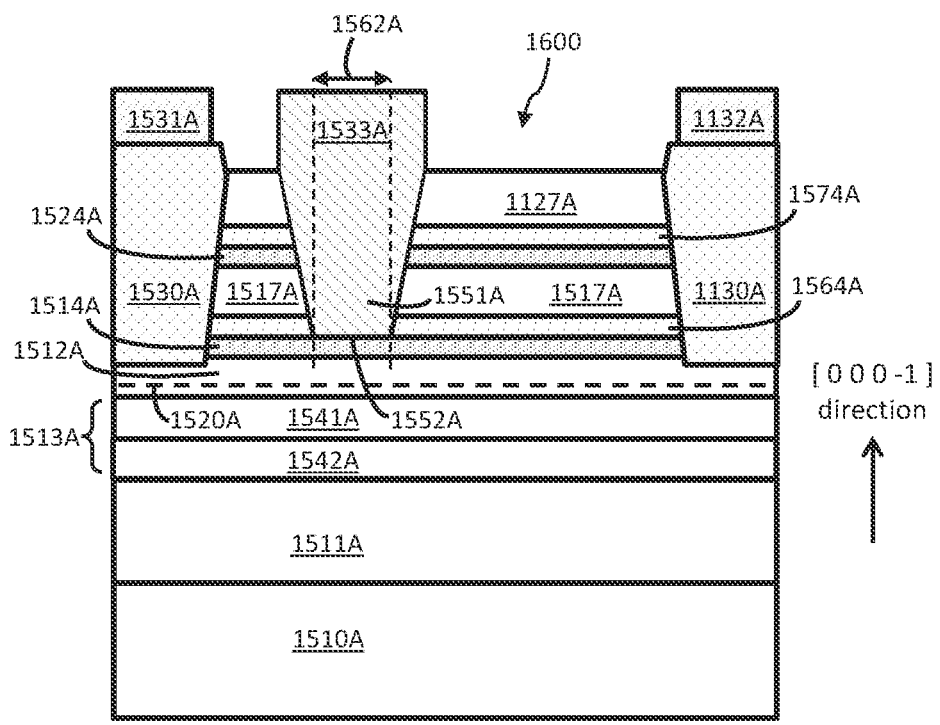
FIG. 16 is a cross-sectional view of another N-polar III-N transistor structure that can be formed from the material structure of FIG. 15.

In some cases, it may be desirable to suppress or prevent the formation of one or more of the secondary 2DEGs. This can be achieved by inclusion of one or more p-type layers directly overlying any of the etch stop layers. FIG. 15 is a cross-sectional view of another epitaxially formed N-polar III-N material structure 1500 that is the same as material structure 1100, but further includes a first p-type III-N layer 1564 between etch stop layer 1514 and cap layer 1517 and a second p-type III-N layer 1574 between etch stop layer 1524 and cap layer 1527. Each of the p-type layers 1564 and 1574 may be formed of the same semiconductor material or have the same bandgap as the overlying cap layer 1517 and 1527, respectively. FIG. 16 is a cross-section view of a transistor 1600 that can be formed from material structure 1500. Transistor 1600 is the same as transistor 1200A, but further includes p-type layers 1564A and 1574A in the access regions, as shown. Similarly, any of the transistors described herein that include one or more etch stop layers can further include a p-type III-N layer directly over the etch stop layer (e.g., between the etch stop layer and the overlying cap layer).

Figure 17:
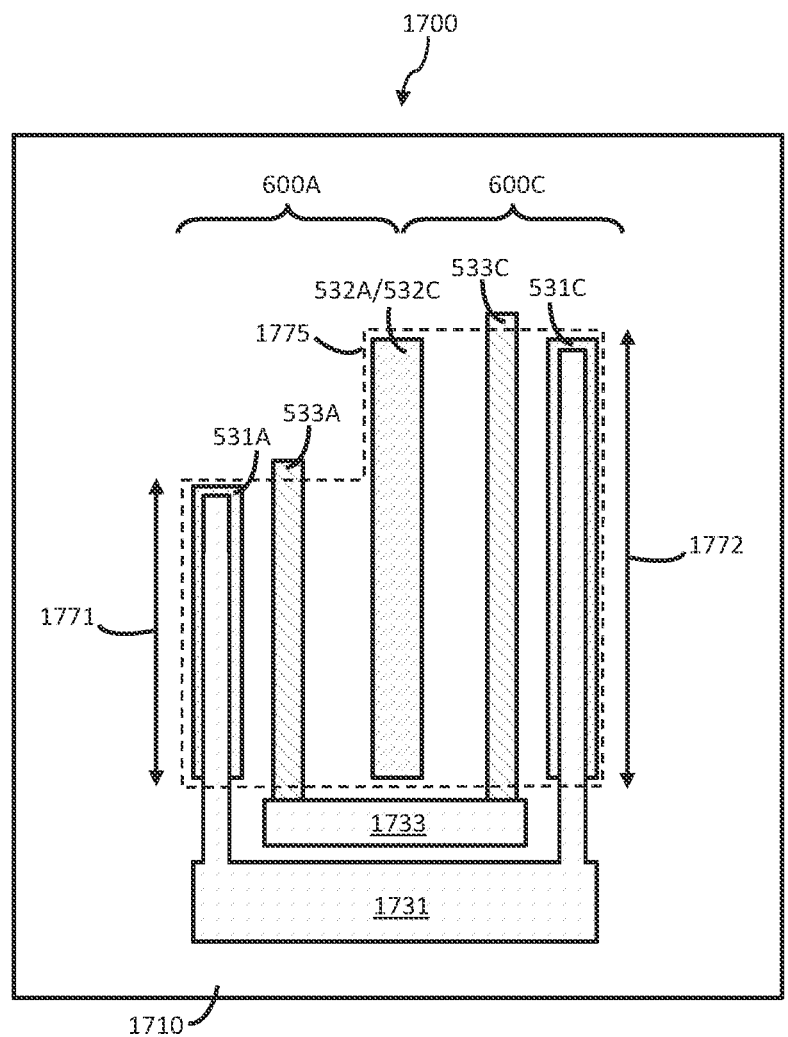
FIG. 17 is a plan view of a semiconductor device including 2 or more monolithically integrated transistors.

FIG. 17 shows a plan view of a semiconductor device 1700 in which transistors 600A and 600C of FIGS. 6A and 6C, respectively, are monolithically integrated on substrate 1710 and are also combined into a single hybrid device. In the configuration of semiconductor device 1700, the two transistors share a common drain 532A/532C, a source pad 1731 connects the sources 531A and 531C of the transistors to form a common source, and a gate pad 1733 connects the gates 533A and 533C of the transistors to form a common gate. The active region of the hybrid device (i.e., the region containing the 2DEG channels shown in FIGS. 6A and 6C) is contained within dashed line 1775. In the non-active region that surrounds the active region, the 2DEG channel is eliminated or rendered non-conductive, for example by etching away some of the III-N layers or by ion implantation. The hybrid device is configured such that the gate width 1771 of transistor 600A is different than the gate width 1772 of transistor 600C. Although the gate width 1771 of transistor 600A is shown to be smaller than the gate width 1772 of transistor 600C, it may alternatively be made larger than the gate width 1772 of transistor 600C. Furthermore, any combination of transistors 600A, 600B, and 600C may be combined to form a hybrid device as shown. Also, any combination of transistors 900A, 900B, and 900C may be combined to form a hybrid device as shown. Also, any combination of transistors 1200A, 1200B, and 1200C may be combined to form a hybrid device as shown. As used herein, the "gate width" of a transistor is the width (e.g., in a direction substantially perpendicular to the direction of current flow) of the portion of the gate metal that is directly over the active region of the transistor (e.g., the region that contains the channel of the transistor).

Figure 18:
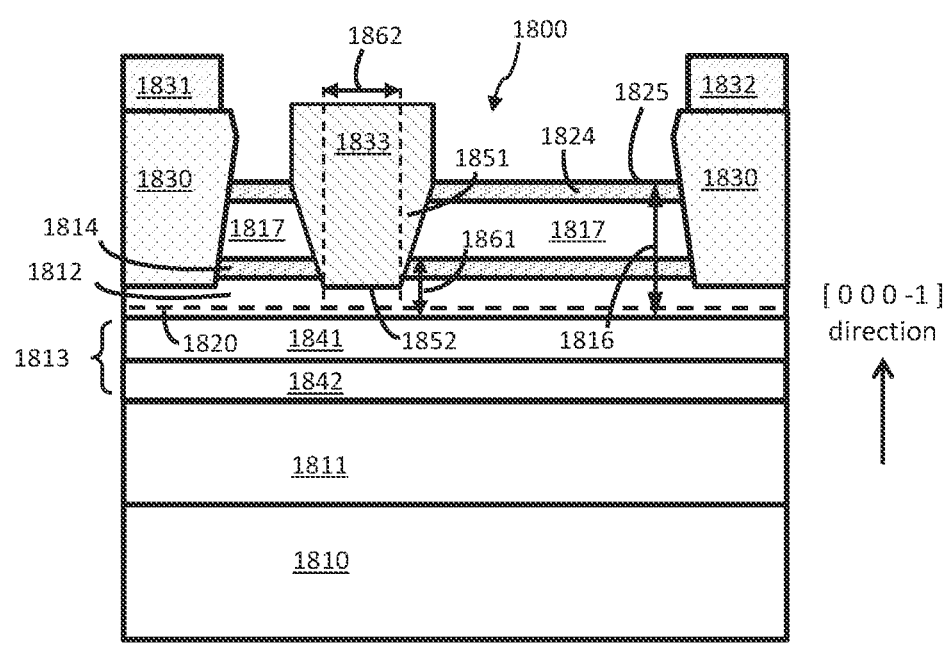
FIG. 18 is a cross-sectional view of another N-polar III-N transistor structure.

In some cases, for any of the transistors described herein in which one or more etch stop layers are included in the semiconductor material structure, etches that are used to form recesses (e.g., gate recesses) into the semiconductor material may not stop precisely at the upper surface of an etch stop layer. For example, FIG. 18 shows a cross-sectional view of a transistor 1800 that is the same as transistor 1200B of FIG. 12B, except that recess 1851 extends at least partially through or through the entire thickness of etch stop layer 1814. In forming recess 1851, the etch stop layer 1814 can still allow for improved precision in etch depth as compared to the recess formed in transistor 1200B. Additionally, for any of the other transistors herein in which one or more etch stop layers are included in the semiconductor material structure, any of the gate or access region recess etches that are shown to stop at the upper surface of an etch stop layer can alternatively be formed at least partially through or through an entire thickness of the etch stop layer, and in some cases at least partially through any layers beneath the etch stop layer.

Various devices and their material structures have been described above, along with methods of forming the devices and material structures. However, it should be understood that they have been presented by way of example only, and not limitation. The implementations have been particularly shown and described, but it will be understood that various changes in form and details may be made. For example, for any of the transistors described herein, a gate insulator or gate dielectric can be included between the gate metal and the underlying semiconductor material. Accordingly, other implementations are within the scope of the following claims.

What is claimed is:

1. A semiconductor device, comprising:
  a semiconductor wafer comprising a III-N material structure, the III-N material structure comprising:
    a III-N backbarrier; and
    a III-N channel layer over an N-face of the III-N backbarrier, the III-N channel layer having a group-III face adjacent to the III-N backbarrier and a second N-face on a side opposite the group-III face, wherein a bandgap of the III-N backbarrier is greater than a bandgap of the III-N channel layer;
  a first transistor in a first region of the semiconductor wafer, the first transistor comprising:
    a first portion of the III-N backbarrier;
    a first portion of the III-N channel layer having a first 2DEG channel therein, wherein the first portion of the III-N channel layer has a first recess adjacent to a first portion of the second N-face, the first recess having a first bottom surface;
    a first gate that is at least partially in the first recess; and
    a first source and a first drain, wherein the first gate is between the first source and the first drain; and
  a second transistor in a second region of the semiconductor wafer, the second transistor comprising:
    a second portion of the III-N backbarrier;
    a second portion of the III-N channel layer having a second 2DEG channel therein, wherein the second portion of the III-N channel layer has a second recess adjacent to a second portion of the second N-face, the second recess having a second bottom surface;
    a second gate that is at least partially in the second recess; and
    a second source and a second drain, wherein the second gate is between the second source and the second drain; wherein
  a total distance between a first lowest point of the first bottom surface and a first portion of the group-III face at the first portion of the III-N channel layer is at least 1.2 times a total distance between a second lowest point of the second bottom surface and a second portion of the group-III face at the second portion of the III-N channel layer.

2. The semiconductor device of claim 1, wherein the first transistor is part of a first circuit and the second transistor is part of a second circuit.

3. The semiconductor device of claim 2, wherein the first circuit is an RF switch, and the second circuit is a power amplifier or a low noise amplifier.

4. The semiconductor device of claim 1, wherein the first transistor further comprises a first portion of a dielectric layer over the first portion of the III-N channel layer, and wherein the second transistor further comprises a second portion of the dielectric layer over the second portion of the III-N channel layer.

5. The semiconductor device of claim 4, wherein the first portion of the dielectric layer is thicker than the second portion of the dielectric layer.

6. The semiconductor device of claim 1, wherein the first drain and the second drain are shared and the first gate and the second gate are shared.

7. The semiconductor device of claim 1, wherein a first total width of the first gate is different from a second total width of the second gate.

8. The semiconductor device of claim 1, wherein the total distance between the first lowest point of the first bottom surface and the first portion of the group-III face at the first portion of the III-N channel layer is the shortest distance between the first lowest point of the first bottom surface and any point of the first portion of the group-III face, and wherein the total distance between the second lowest point of the second bottom surface and the second portion of the group-III face at the second portion of the III-N channel layer is the shortest distance between the second lowest point of the second bottom surface and any point of the second portion of the group-III face.

* * * * *